(12) United States Patent
Arai et al.

(10) Patent No.: US 7,858,159 B2
(45) Date of Patent: Dec. 28, 2010

(54) PHOTOCURABLE COMPOSITION FOR SEALANT, LIQUID CRYSTAL SEALANT, AND LIQUID CRYSTAL PANEL

(75) Inventors: Hisayosi Arai, Sakura (JP); Hiroko Sakurai, Sakura (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 326 days.

(21) Appl. No.: 12/065,583

(22) PCT Filed: Aug. 30, 2006

(86) PCT No.: PCT/JP2006/317137
§ 371 (c)(1),
(2), (4) Date: Mar. 3, 2008

(87) PCT Pub. No.: WO2007/026784
PCT Pub. Date: Mar. 8, 2007

(65) Prior Publication Data
US 2009/0131550 A1    May 21, 2009

(30) Foreign Application Priority Data
Sep. 2, 2005 (JP) ............... 2005-254846

(51) Int. Cl.
*G02F 1/1339* (2006.01)
*C08F 230/02* (2006.01)
*C08F 220/30* (2006.01)

(52) U.S. Cl. ............ 428/1.5; 428/1.54; 428/1.55; 430/20; 430/281.1; 430/287.1; 522/171

(58) Field of Classification Search ............. 428/1.5, 428/1.54, 1.55; 430/20, 287.1, 281.1; 522/171
See application file for complete search history.

(56) References Cited

U.S. PATENT DOCUMENTS

| | | | |
|---|---|---|---|
| 6,013,339 A * | 1/2000 | Yamada et al. ............. | 428/1.53 |
| 6,299,949 B1 * | 10/2001 | Shioda et al. ............. | 428/1.5 |
| 7,521,099 B2 * | 4/2009 | Ochi et al. ............. | 428/1.5 |
| 7,521,100 B2 * | 4/2009 | Imaizumi et al. ............. | 428/1.53 |
| 7,537,810 B2 * | 5/2009 | Hayashi et al. ............. | 428/1.1 |
| 7,678,433 B2 * | 3/2010 | Ochi et al. ............. | 428/1.5 |

FOREIGN PATENT DOCUMENTS

| | | |
|---|---|---|
| EP | 1627867 A1 | 2/2006 |
| JP | 2005-171135 A | 6/2005 |
| WO | 2004/103949 A1 | 12/2004 |

OTHER PUBLICATIONS

International Search Report of PCT/JP2006/317137, date of mailing Dec. 12, 2006.

* cited by examiner

*Primary Examiner*—Susan W Berman
(74) *Attorney, Agent, or Firm*—Westerman, Hattori, Daniels & Adrian, LLP

(57) ABSTRACT

The photocurable composition for a sealant of the present invention includes a compound represented by general formula (1):

$$A^1\text{-}Y^1\text{—}B^1\text{—}Y^2\text{-}A^2 \tag{1}$$

(wherein $A^1$ and $A^2$ each represents, independently, a monovalent group having a cyclic π-electron conjugated structure;

$Y^1$ and $Y^2$ each represents, independently, a divalent group represented by general formula (4); and

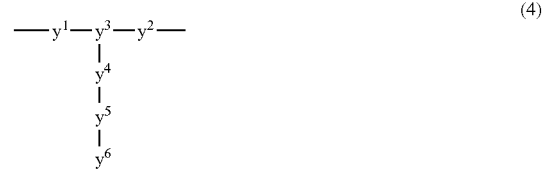

$B^1$ represents (i) a divalent alicyclic hydrocarbon group, (ii) a divalent aromatic hydrocarbon group, (iii) a divalent heterocyclic group, (iv) a divalent aliphatic hydrocarbon group of 1 to 6 carbon atoms, or (v) a divalent group in which two or more group selected from the group consisting of a divalent alicyclic hydrocarbon group, a divalent aromatic hydrocarbon group, a divalent heterocyclic group, a divalent aliphatic hydrocarbon group of 1 to 6 carbon atoms, a carbonyl group, an ether group, a thioether group, and a $SO_2$ group are linked).

6 Claims, No Drawings

PHOTOCURABLE COMPOSITION FOR SEALANT, LIQUID CRYSTAL SEALANT, AND LIQUID CRYSTAL PANEL

TECHNICAL FIELD

The present invention relates to a photocurable composition which is used to seal or end-seal panels such as a liquid crystal panel, an organic EL display panel, and an electronic paper, and to a liquid crystal sealant composed of the photocurable composition, and a liquid crystal panel using the liquid crystal sealant.

BACKGROUND ART

In general, a liquid crystal panel is constituted by putting a back substrate provided with a thin film transistor, a pixel electrode and an alignment layer, and a front substrate provided with a color filter, an electrode and an alignment layer opposite each other, and injecting a liquid crystal between both substrates. For the purpose of bonding two substrates, a sealant is used.

At present, a heat-curable sealant containing an epoxy-based heat-curable resin as a main component is mainly used as the sealant, and it requires about 30 minutes or more until curing is completed and thus there is sometimes shift in the lateral direction of two preliminarily positioned substrates. In a sealing method such as an ODF method (One-Drop Filling method: liquid crystal drop method) in which a liquid crystal is directly contacted with an uncured sealant, there arises a problem that the uncured sealant component is dissolved in the liquid crystal between until curing is completed and thus the voltage-holding ratio of the resulting liquid crystal panel decreases.

Therefore, there have recently been increasing requirements for a photocurable sealant which is quickly cured and also can be used in an ODF method.

A cation-curable sealant and a radical-curable sealant are known as photocurable sealants. In general, the cation-curable sealant easily satisfies both excellent adhesion and excellent moisture barrier properties. However, there arose a problem that ionic compounds generating from a photocationic initiator with light irradiation dissolve in liquid crystals and cause contamination. In contrast, the radical polymerizable sealant does not generate ionic compounds and therefore causes less contamination to liquid crystals. However, there arose a problem that it is difficult to satisfy both high adhesion and low moisture permeability. There is known a photocurable composition for a sealant in which a maleimide having a condensed-type alicyclic structure such as a dicyclodecane structure, an adamantane ring or a tricyclodecane ring is used (for example, refer to Patent Document 1). The sealant has an alicyclic structure and is therefore excellent in moisture barrier properties. However, the sealant does not sufficiently satisfy adhesion required in the case of aiming at a more solid liquid crystal panel (for example, adhesion of 6 MPa or more is recently required).

[Patent Document 1]
Japanese Unexamined Patent Application, First Publication No. 2005-171135

DISCLOSURE OF THE INVENTION

An object to be achieved by the present invention is to provide a radical polymerizable photocurable composition for a sealant, which has both excellent adhesion to a substrate for a liquid crystal cell, such as glass, and excellent moisture barrier properties.

The present inventors have achieved the above object by introducing a hydrophobic group having a π-electron conjugated structure, which is considered to cause π-π stacking, into a molecular end of a sealant.

Specifically, the present inventors have found that moisture permeability of the sealant can be remarkably improved by allowing a group having a π-electron conjugated structure to be pendant on a polymer constituting a three-dimensional structure, thus causing π-π stacking of the structure, and also have found that there are the effects of suppressing shrinkage upon curing during sealant curing and increasing inner cohesion of the sealant.

Namely, the present invention provides a photocurable composition for a sealant, including a compound represented by general formula (1):

(wherein $A^1$ and $A^2$ each represents, independently, a monovalent group having a cyclic π-electron conjugated structure;

$Y^1$ and $Y^2$ each represents, independently, a divalent group represented by general formula (4):

(wherein $y^1$ and $y^2$ represent a linking group selected from a single bond, an ether bond, an ester bond, a urethane bond, and —NR— (wherein R represents an alkyl group of 1 to 4 carbon atoms, or a benzyl group), or a group in which one of the linking group and one of an alkylene group of 1 to 2 carbon atoms are linked (wherein the alkylene group is bonded to $A^1$ or $A^2$), in which $y^1$ is bonded to $A^1$ or $A^2$ and $y^2$ is bonded to $B^1$, $y^3$ represents an alkyltriyl group of 1 to 3 carbon atoms, $y^4$ represents a single bond, an ether bond, an ester bond, or a urethane bond, $y^5$ represents a single bond, an alkylene group of 1 to 5 carbon atoms, or an oxyalkylene group of 1 to 6 carbon atoms (wherein 2 to 4 oxyalkylene groups may be contiguous), or a phenylene group (wherein $y^4$ is invariably a single bond when $y^5$ is a single bond), and $y^6$ represents a polymerizable group selected from the group consisting of a (meth)acryloyl group, a (meth)acryloyloxy group, a (methyl)acrylamide group, a vinyl group, and a vinyloxy group); and $B^1$ represents (i) a divalent alicyclic hydrocarbon group, (ii) a divalent aromatic hydrocarbon group, (iii) a divalent heterocyclic group, (iv) a divalent aliphatic hydrocarbon group of 1 to 6 carbon atoms, or (v) a divalent group in which two or more groups selected from the group consisting of a divalent alicyclic hydrocarbon group, a divalent aromatic hydrocarbon group, a divalent heterocyclic group, a divalent aliphatic hydrocarbon group of 1 to 6 carbon atoms, a carbonyl group, an ether group, a thioether group, and a $SO_2$ group are linked).

Also, the present invention provides a liquid crystal sealant using the above photocurable composition for a sealant.

Also, the present invention provides a liquid crystal panel using the above liquid crystal sealant.

According to the present invention, it is possible to provide a sealant which satisfies both moisture barrier properties and adhesion (particularly, adhesion of 6 MPa or more). The present invention is useful as a sealant for a liquid crystal panel.

BEST MODE FOR CARRYING OUT THE INVENTION

In the general formula (1), $A^1$ and $A^2$ each represents, independently, a monovalent group having a cyclic π-electron conjugated structure.

The cyclic π-electron conjugated structure refers to a structure in which a plurality of benzene rings as π-electron conjugated molecules or a plurality of benzene rings are condensed, and $A^1$ and $A^2$, $A^1$ and $A^1$, $A^2$ and $A^2$, which are adjacent between molecules, are capable of π-π stacking.

$A^1$ and $A^2$ serve as the site which is pendant on a polymer constituting a three-dimensional structure when the compound represented by the general formula (1) is photocured. It is considered that it is possible to impart an ability of π-π stacking to the site. It is considered that, by increasing the density of a cured article, moisture permeability of a cured film can be decreased and also shrinkage upon curing during sealant curing can be suppressed and the effect of increasing inner cohesion of the sealant is exerted, thus making it possible to satisfy both excellent barrier properties and excellent adhesion.

Although it is anticipated that a structure having strong π-π stacking has excellent moisture barrier properties, an excessively long π-electron conjugated system inhibits excitation of a photoradical initiator, and thus there may arise a problem that a photopolymerization initiator and a light source which can be used are limited and also reactive radicals are scavenged. Therefore, the number of carbon atoms constituting $A^1$ and $A^2$ is preferably within a range from 6 to 20. In the case of $A^1$ and $A^2$ in which the ring is composed only of a benzene ring, the number of rings is about 4 when the benzene ring is condensed, while the number of rings is about 3 when the benzene ring is not condensed.

Specifically, $A^1$ and $A^2$ preferably represent a monovalent group of a condensed ring structure composed of 2 to 4 rings (wherein a ring constituting a condensed ring is an aromatic ring, a heterocyclic ring, or an alicyclic ring of 3 to 10 carbon atoms), or a group represented by general formula (3).

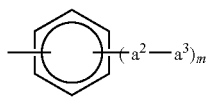
(3)

In the monovalent group of a condensed ring structure composed of 2 to 4 rings, the total number of carbon atoms, oxygen atoms, sulfur atoms and nitrogen atom constituting the condensed ring is preferably from 6 to 20, more preferably from 9 to 18, and most preferably from 9 to 16. As long as the effect of the present invention is not adversely affected, the group may have a substituent. Specific examples of the substituent include benzene, indene, naphthalene, biphenylene, acenaphthylene, fluorene, phenanthrene, anthracene, triphenylene, pyrene, chrysene, naphthacene, a perylene ring, thianthrene, isobenzofuran, chromene, xanthene, phenoxathiin, indole, quinoline, isoquinoline, phthalazine, quinazoline, cinnoline, acridine, phenazine, phenothiazine, carbazole, and tetrahydroxynaphthalene.

In the general formula (3), $a^2$ represents a single bond, or an alkylene group of 1 to 10 carbon atoms such as a methylene group, an ethylene group, or a t-propylene group.

$a^3$ represents a hydrogen atom, an aromatic hydrocarbon group of 6 to 12 carbon atoms, an aromatic heterocyclic group of 6 to 12 carbon atoms, or an alicyclic hydrocarbon group of 3 to 10 carbon atoms.

Specific examples of the aromatic hydrocarbon group of 6 to 12 carbon atoms include benzene, indene, naphthalene, and biphenylene. Specific examples of the aromatic heterocyclic group of 6 to 12 carbon atoms include thianthrene, isobenzofuran, chromene, phenoxathiin, indole, quinoline, isoquinoline, phthalazine, quinazoline, cinnoline, phenazine, phenothiazine, and carbazole. Specific examples of the alicyclic hydrocarbon group of 3 to 10 carbon atoms include cyclohexane, tricyclodecane, and adamantane.

m represents an integer from 1 to 2, of which 1 is preferable.

Examples of the group represented by the general formula (3) include structures containing a toluene structure, a xylene structure, a nonylbenzene structure, a biphenyl structure, a terphenyl structure, a 2,2-diphenylpropane structure, a diphenylmethylene structure, a phenylcyclohexane structure, or a phenyladamantane structure.

Of these structures, a biphenyl structure, a 2,2-diphenylpropane structure or a diphenylmethylene structure is preferably used since it has high moisture barrier properties and is industrially cheap.

Specifically, in the general formula (1), $A^1$ and $A^2$ preferably represent a group selected from structural formulas A-1 to A-23 shown below, of which a group selected from the structural formulas A-3, A-14, A-15, A-17, and A-18 shown below is preferably used since it can achieve higher barrier properties and also it is less likely to inhibit excitation of the photopolymerization initiator used in the liquid crystal sealant.

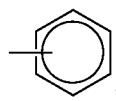
A-1

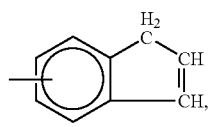
A-2

A-3

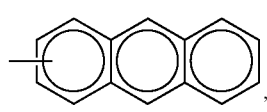
A-4

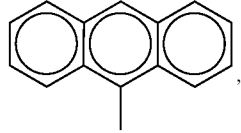
A-5

A-6 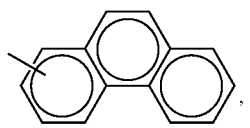

A-7 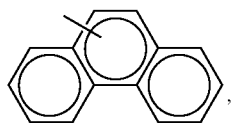

A-8 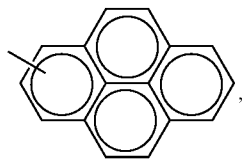

A-9 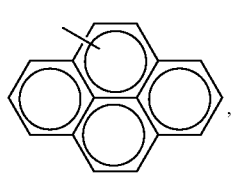

A-10 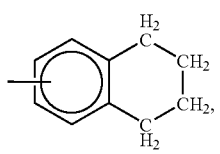

A-11 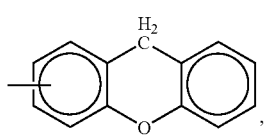

A-12 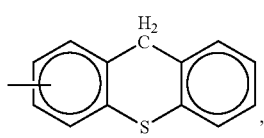

A-13 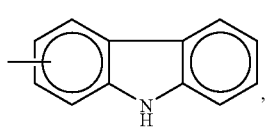

A-14 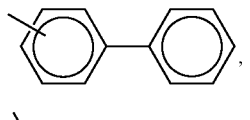

A-15 

A-16 

A-17 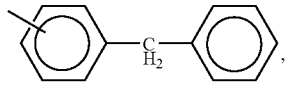

A-18 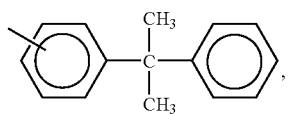

A-19 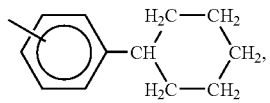

A-20 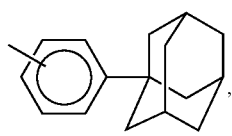

A-21 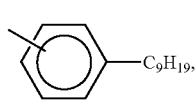

A-22 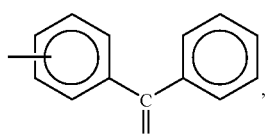

A-23 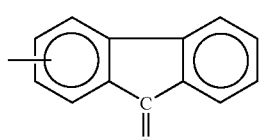

A-3 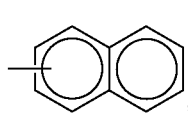

A-14 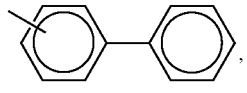

A-15 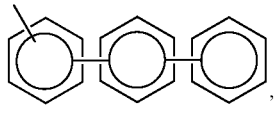

A-17 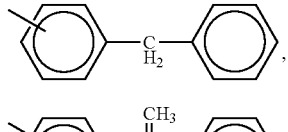

A-18 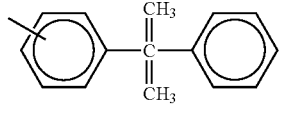

In the general formula (1), $Y^1$ and $Y^2$ each represents, independently, a divalent group having a polymerizable group selected from the group consisting of a (meth)acryloyl group, a (meth)acryloyloxy group, a (meth)acrylamide group, a vinyl group, and a vinyloxy group. The polymerizable group is preferably a (meth)acryloyl group, a (meth)acryloyloxy group, or a (meth)acrylamide group, and most preferably a (meth)acryloyloxy group.

In the present invention, the structure of the compound represented by the general formula (1) is decided so that $A^1$ and $A^2$ serve as the site which is pendant on a polymer constituting a three-dimensional structure when the compound represented by the general formula (1) is photocured. Therefore, a group having polymerizable groups represented by $Y^1$ and $Y^2$ is introduced between $A^1$ and $B^1$, or $B^1$ and $A^2$. The group having polymerizable groups represented by $Y^1$ and $Y^2$ is not specifically limited as long as it is a divalent group having the polymerizable groups so as to obtain the effect of the present invention. An available group preferably has a structure which enables easy introduction between $A^1$ and $B^1$, or $B^1$ and $A^2$ in the field of organic synthesis.

For example, the group preferably has a structure in which the space between $A^1$ and $B^1$, or $B^1$ and $A^2$ is composed of a group obtained by a reaction such as an etherification reaction, an esterification reaction, or a urethanization reaction, which is employed commonly for introduction in the organic synthesis, and a polymerizable group is pendant between the groups.

As such a group, for example, $Y^1$ and $Y^2$ are represented by a divalent group represented by the general formula (4).

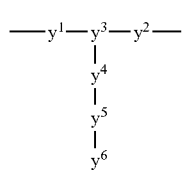
(4)

In the general formula (4), $y^1$ and $y^2$ represent a linking group selected from a single bond, an ether bond, an ester bond, a urethane bond, and —NR— (R represents an alkyl group of 1 to 4 carbon atoms, or a benzyl group), or a group in which one linking group and one alkylene group of 1 to 2 carbon atoms are linked (wherein the alkylene group is bonded to $A^1$ or $A^2$), $y^1$ is bonded to $A^1$ or $A^2$ and $y^2$ is bonded to $B^1$.

$y^3$ represents an alkyltriyl group of 1 to 3 carbon atoms. When $y^3$ is an alkyltriyl group of 2 to 3 carbon atoms, an ethylene group or a methylene group may be bonded to $y^1$, $y^2$, or $y^4$.

$y^4$ represents a single bond, an ether bond, an ester bond, or a urethane bond.

$y^5$ represents a single bond, an alkylene group of 1 to 5 carbon atoms, an oxyalkylene group of 1 to 6 carbon atoms, or a phenylene group. When $y^5$ is a single bond, $y^4$ is invariably a single bond.

$y^6$ represents a polymerizable group selected from the group consisting of a (methyl)acryloyl group, a (meth)acryloyloxy group, a (methyl)acrylamide group, a vinyl group, and a vinyloxy group, of which a (meth)acryloyl group or a (meth)acryloyloxy group is preferred because it has high reactivity.

In the present invention, a group other than $y^6$ is appropriately decided and it is considered that the group is not particularly involved in the effect of the present invention.

As a specific example in which synthesis is easily conducted, a divalent group is exemplified, in which a structure represented by structural formula (y123) shown below in the general formula (4) is a group selected from structural formulas y-1 to y-31 shown below:

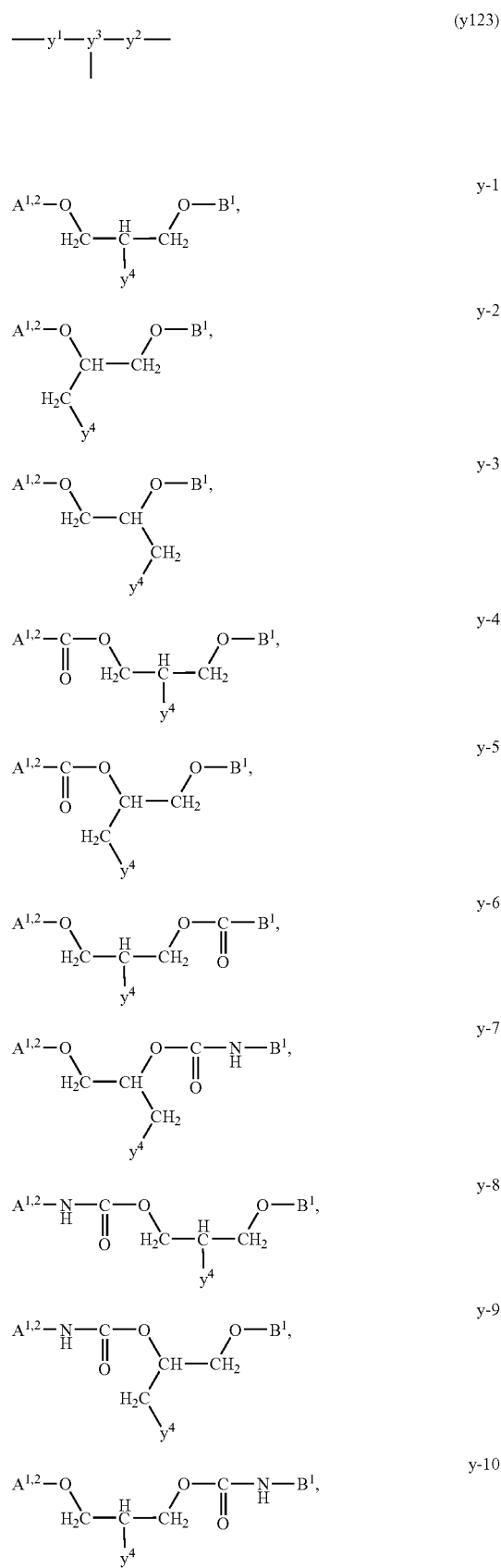

-continued
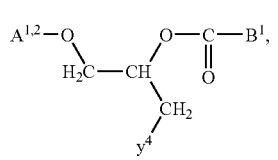
y-11
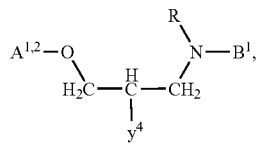
y-12
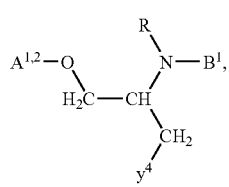
y-13
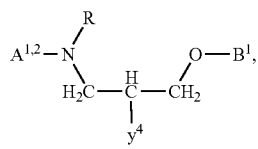
y-14
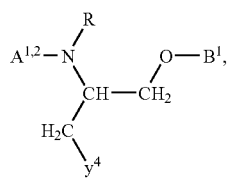
y-15
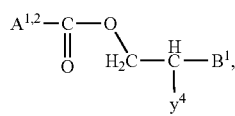
y-16
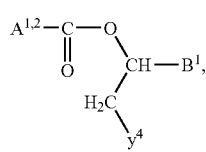
y-17
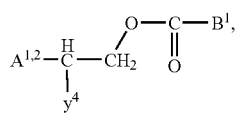
y-18
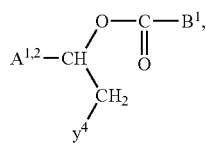
y-19
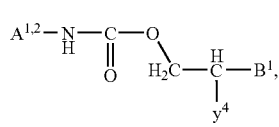
y-20
-continued
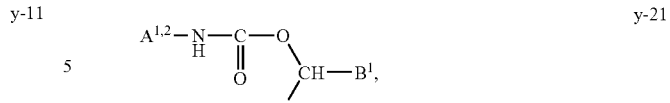
y-21
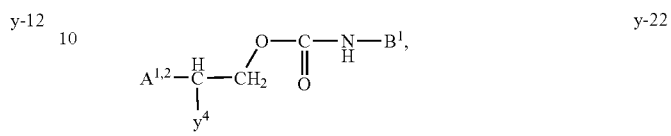
y-22
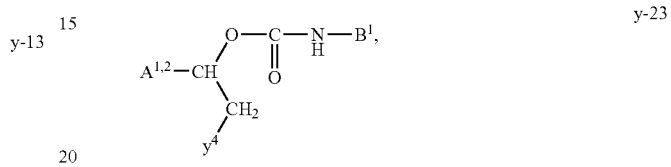
y-23
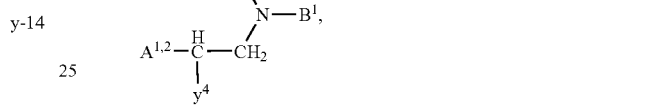
y-24
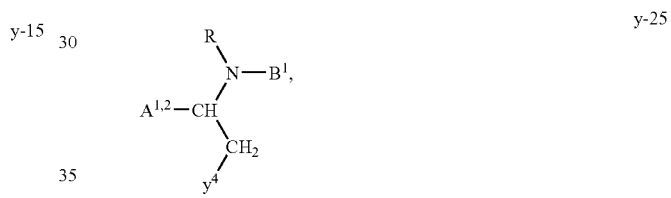
y-25
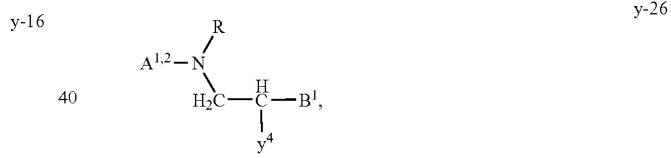
y-26
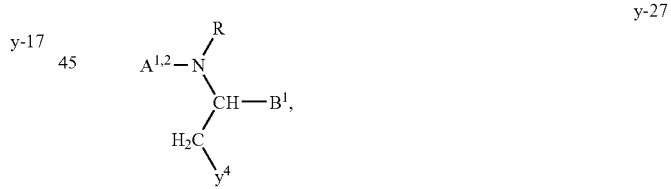
y-27
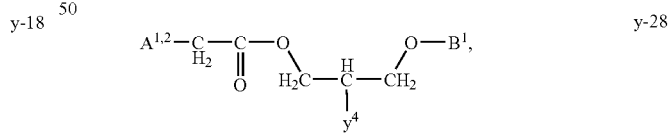
y-28
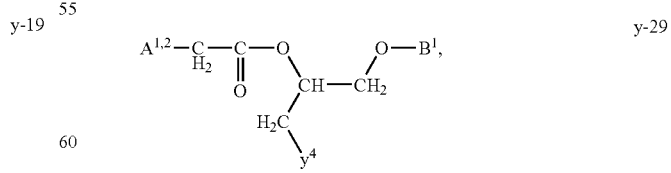
y-29
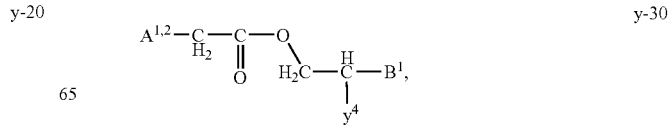
y-30

-continued

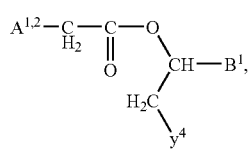
y-31

(wherein R represents a hydrocarbon group of 1 to 3 carbon atoms or a phenyl group, $A^{1, 2}$ represents $A^1$ or $A^2$ in the general formula (1), $B^1$ represents $B^1$ in the general formula (1), $y^4$ represents $y^4$ in the general formula (4), and each group is described as a group to which a structure represented by the structural formula (y123) shown above binds); and the structure of $-y^4-y^5-y^6$ which binds to $y^3$ is a group selected from structural formulas y-51 to y-56 shown below:

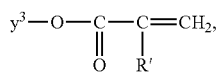
y-51

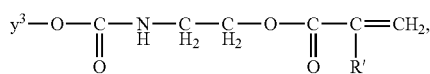
y-52

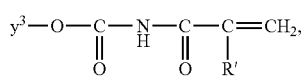
y-53

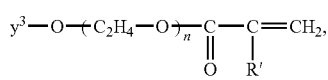
y-54

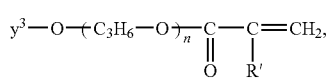
y-55

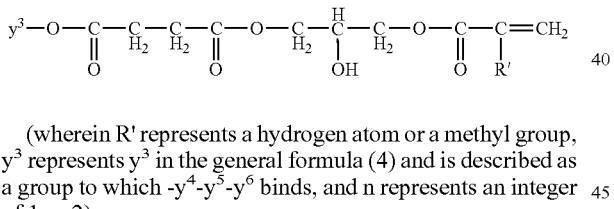
y-56

(wherein R' represents a hydrogen atom or a methyl group, $y^3$ represents $y^3$ in the general formula (4) and is described as a group to which $-y^4-y^5-y^6$ binds, and n represents an integer of 1 or 2).

In the general formula (1), $B^1$ represents (i) a divalent saturated or unsaturated alicyclic hydrocarbon group, (ii) a divalent aromatic hydrocarbon group, (iii) a divalent heterocyclic group, (iv) a divalent aliphatic hydrocarbon group of 1 to 6 carbon atoms, (v) a divalent group in which two or more groups selected from the group consisting of a divalent alicyclic hydrocarbon group, a divalent aromatic hydrocarbon group, a divalent heterocyclic group, a divalent aliphatic hydrocarbon group of 1 to 6 carbon atoms, a carbonyl group, an ether group, a thioether group, and a $SO_2$ group are linked.

$B^1$ preferably has a structure so that a cured article maintains a high glass transition temperature (hereinafter abbreviated to Tg) and compatibility with other components in the sealant is enhanced. Specific examples thereof include a divalent alicyclic hydrocarbon group of 3 to 10 carbon atoms, a divalent aromatic hydrocarbon group of 6 to 20 carbon atoms, an alkylene group of 1 to 6 carbon atoms, or a structure represented by $-b^1-b^2-b^3-$ (wherein $b^1$ and $b^3$ represent a divalent alicyclic hydrocarbon group of 3 to 10 carbon atoms, or a divalent aromatic hydrocarbon group of 6 to 12 carbon atoms, and $b^2$ represents a single bond, an alkylene group of 1 to 6 carbon atoms, a carbonyl group, an ether group, a thioether group, or a $SO_2$ group).

The divalent alicyclic hydrocarbon group of 3 to 10 carbon atoms includes, for example, a structure containing a cyclohexane ring, a norbornene ring, an isophorone ring, a decalin ring, a tricyclodecane ring, or an adamantane ring. The divalent aromatic hydrocarbon ring of 6 to 20 carbon atoms includes, for example, a structure containing an indene ring, a naphthalene ring, a biphenylene ring, an acenaphthylene ring, a fluorene ring, a phenanthrene ring, an anthracene ring, a triphenylene ring, a pyrene ring, a chrysene ring, a naphthacene ring, or a perylene ring. The alkylene group of 1 to 6 carbon atoms includes, for example, a structure containing an ethylene group, a 2,2-dimethylpropane group, or an n-hexane group. The structure represented by $-b^1-b^2-b^3-$ (wherein $b^1$ and $b^3$ represents a divalent aliphatic hydrocarbon ring of 3 to 10 carbon atoms, or a divalent aromatic hydrocarbon ring of 6 to 12 carbon atoms, and $b^2$ represents a single bond, an alkylene group of 1 to 6 carbon atoms, a carbonyl group, an ether group, a thioether group, or a $SO_2$ group) includes, for example, a structure containing 2,2-diphenylpropane, diphenylmethylene, 2,2-dicyclohexylpropane, dicyclohexylmethylene, diphenylsulfone, biphenyl, tetramethylbiphenyl, or binaphthyl.

As the structure which binds to $Y^1$ and $Y^2$, groups represented by the structural formulas B-1 to B-16 shown below are preferable, and groups represented by the structural formulas B-1 to B-5 shown below are most preferable.

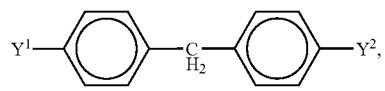
B-1

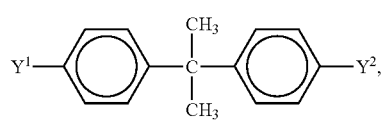
B-2

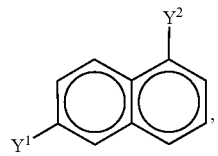
B-3

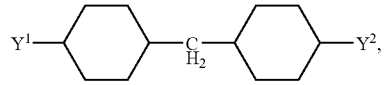
B-4

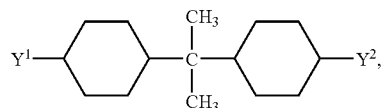
B-5

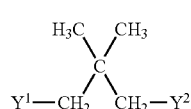
B-6

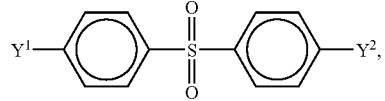
B-7

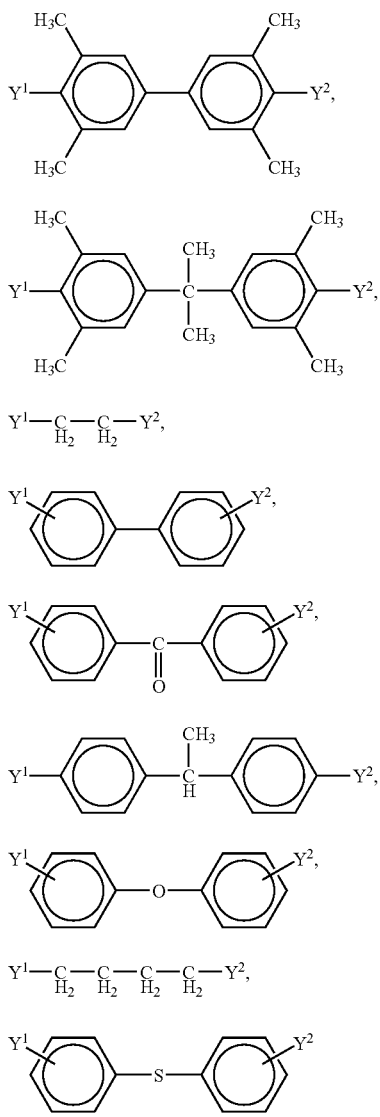

(wherein Y¹ and Y² represent $Y^1$ and $Y^2$ in the general formula (1), and are described as groups to which $B^1$ binds.)

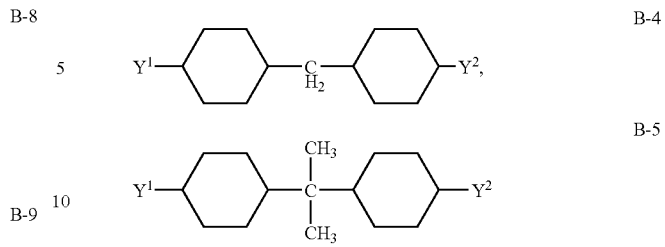

One example of specific aspects of the compound represented by the general formula (1) is shown in Table 1 and Table 2. Examples listed herein are illustrative and are not limited to a specific embodiment.

TABLE 1

| Compound No. | $A^1$ and $A^2$ | Structural formula (y123) | $-y^4-y^5-y^6$ | $B^1$ | Synthesis method |
|---|---|---|---|---|---|
| (1-1) | A-18 | y-1 | y-51 | B-2 | Transesterification reaction |
| (1-2) | A-14 | y-4 | y-52 | B-5 | Urethane reaction |
| (1-3) | A-1 | y-18 | y-52 | B-9 | Urethane reaction |
| (1-4) | A-1 | y-14 | y-51 | B-8 | Transesterification reaction |
| (1-5) | A-14 | y-12 | y-51 | B-10 | Transesterification reaction |
| (1-6) | A-1 | y-7 | y-51 | B-4 | Urethane reaction |
| (1-7) | A-3 | y-1 | y-56 | B-8 | Epoxy addition reaction |
| (1-8) | A-4 | y-4 | y-52 | B-3 | Urethane reaction |
| (1-9) | A-5 | y-4 | y-51 | B-6 | Transesterification reaction |
| (1-10) | A-10 | y-1 | y-52 | B-7 | Urethane reaction |
| (1-11) | A-16 | y-1 | y-52 | B-9 | Urethane reaction |
| (1-12) | A-17 | y-1 | y-51 | B-3 | Transesterification reaction |
| (1-13) | A-19 | y-16 | y-52 | B-15 | Urethane reaction |
| (1-14) | A-20 | y-1 | y-52 | B-2 | Urethane reaction |
| (1-15) | A-21 | y-1 | y-52 | B-1 | Urethane reaction |
| (1-16) | A-22 | y-4 | y-52 | B-2 | Urethane reaction |
| (1-17) | A-23 | y-1 | y-52 | B-2 | Urethane reaction |
| (1-18) | A-3 | y-13 | y-52 | B-12 | Urethane reaction |
| (1-19) | A-1 | y-26 | y-52 | B-15 | Urethane reaction |
| (1-20) | A-1 | y-23 | y-51 | B-1 | Transesterification reaction |

TABLE 2

| Compound No. | $A^1$ and $A^2$ | Structural formula (y123) | $-y^4-y^5-y^6$ | $B^1$ | Synthesis method |
|---|---|---|---|---|---|
| (1-21) | A-14 | y-9 | y-51 | B-2 | Transesterification reaction |
| (1-22) | A-14 | y-21 | y-51 | B-15 | Transesterification reaction |
| (1-23) | A-1 | y-6 | y-52 | B-11 | Urethane reaction |
| (1-24) | A-1 | y-6 | y-52 | B-12 | Urethane reaction |
| (1-25) | A-1 | y-1 | y-52 | B-13 | Urethane reaction |
| (1-26) | A-1 | y-18 | y-52 | B-14 | Urethane reaction |
| (1-27) | A-1 | y-1 | y-52 | B-16 | Urethane reaction |
| (1-28) | A-1 | y-1 | y-52 | B-2 | Urethane reaction |
| (1-29) | A-14 | y-1 | y-52 | B-5 | Urethane reaction |
| (1-30) | A-3 | y-1 | y-52 | B-6 | Urethane reaction |
| (1-31) | A-18 | y-1 | y-52 | B-7 | Urethane reaction |
| (1-32) | A-21 | y-1 | y-52 | B-2 | Urethane reaction |
| (1-33) | A-14 | y-28 | y-52 | B-5 | Urethane reaction |
| (1-34) | A-14 | y-1 | y-52 | B-5 | Urethane reaction |

In Table 1 and Table 2, $A^1$, $A^2$ and $B^1$ respectively represent $A^1$, $A^2$ and $B^1$ in the general formula (1) shown above, structural formula (y123) and $-y^4-y^5-y^6$ respectively represents the structural formula (y123) and $-y^4-y^5-y^6$ in the general formula (4) shown above, and each symbol in compounds (1-1) to (1-34) represents each group described above.

For example, in the compound (1-1), $A^1$ and $A^2$ in the general formula (1) represent a group represented by (A-18) shown above;

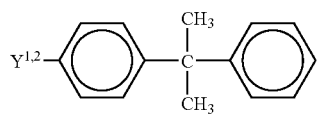

(A-18)

the structural formula (y123) in the general formula (4) is a group represented by y-1 shown above, $-y^4-y^5-y^6$ in the general formula (4) is a group represented by y-51 shown above, and namely, the group represented by the general formula (4) is a group represented by the structural formula shown below; and

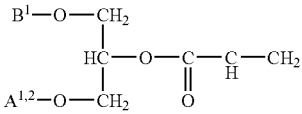

$B^1$ in the general formula (1) is a group represented by B-2 shown above.

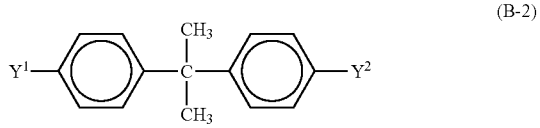

(B-2)

Specifically, the compound (1-1) is the compound represented by the structural formula shown below.

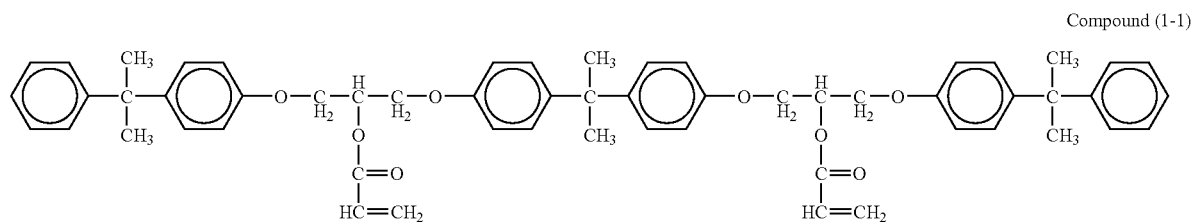

Compound (1-1)

Similarly, the compound (1-2) is specifically the compound represented by the structural formula shown below.

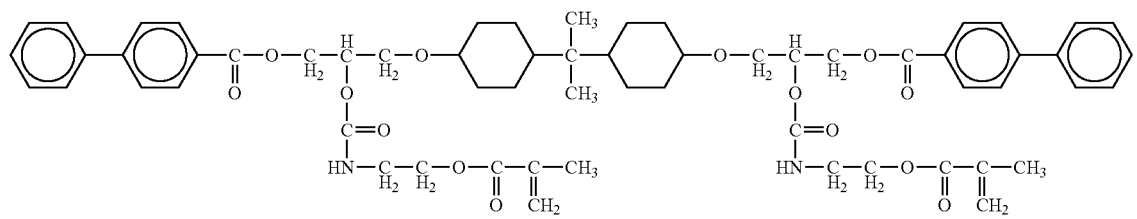

Compound (1-2)

Similarly, the compound (1-3) is specifically the compound represented by the structural formula shown below.

Compound (1-3)

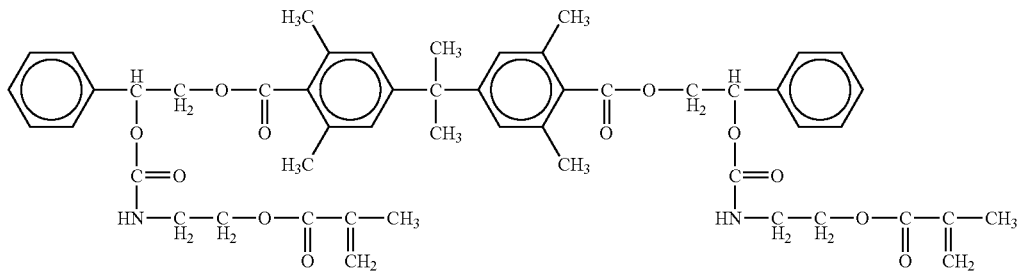

Similarly, the compound (1-4) is specifically the compound represented by the structural formula shown below.

Compound (1-4)

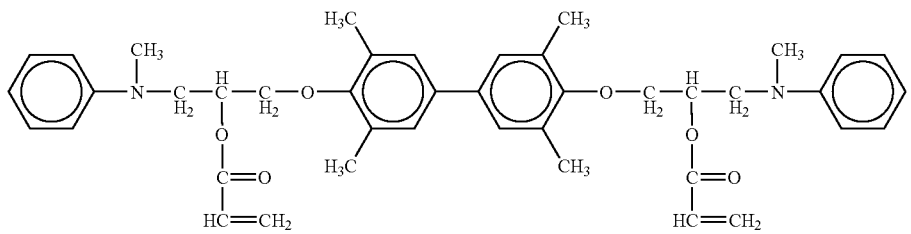

Similarly, the compound (1-5) is specifically the compound represented by the structural formula shown below.

Compound (1-5)

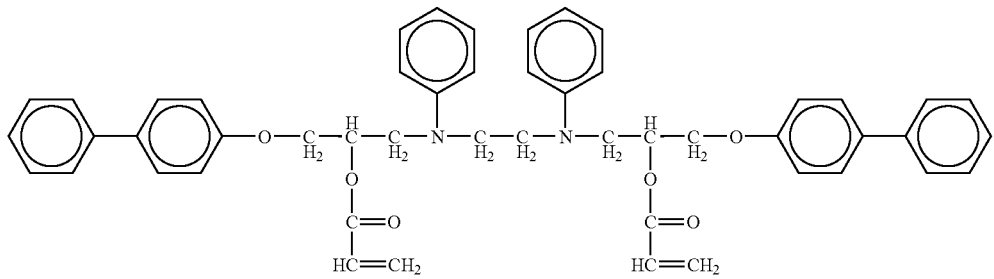

Similarly, the compound (1-6) is specifically the compound represented by the structural formula shown below.

Compound (1-6)

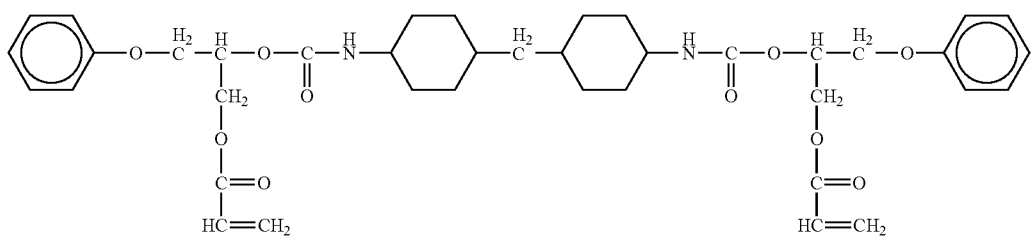

Similarly, the compound (1-7) is specifically the compound represented by the structural formula shown below.
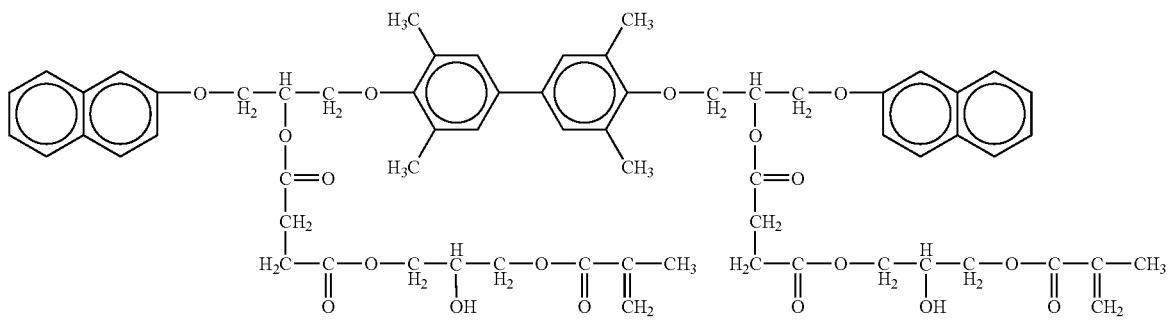
Compound (1-7)
Similarly, the compound (1-8) is specifically the compound represented by the structural formula shown below.
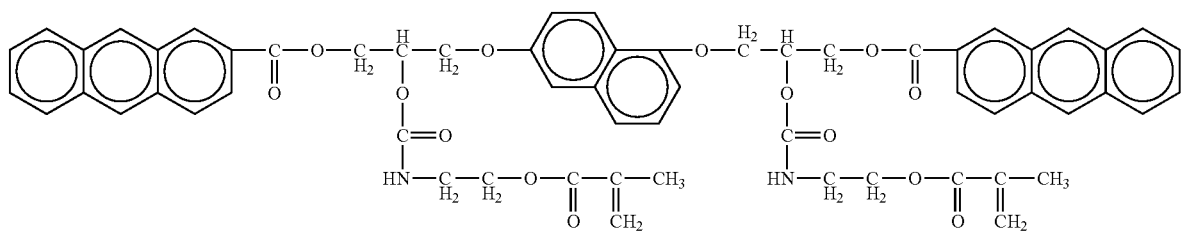
Compound (1-8)
Similarly, the compound (1-9) is specifically the compound represented by the structural formula shown below.
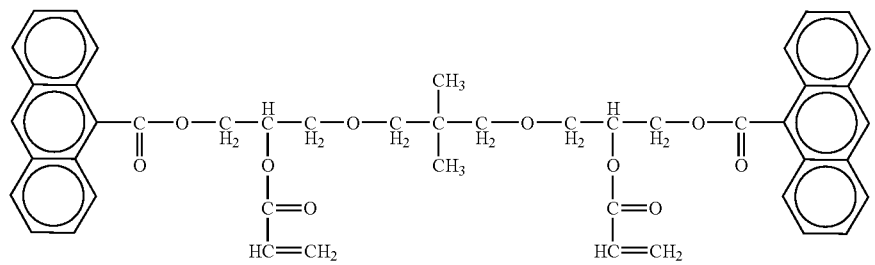
Compound (1-9)

Similarly, the compound (1-10) is specifically the compound represented by the structural formula shown below.
Compound (1-10)
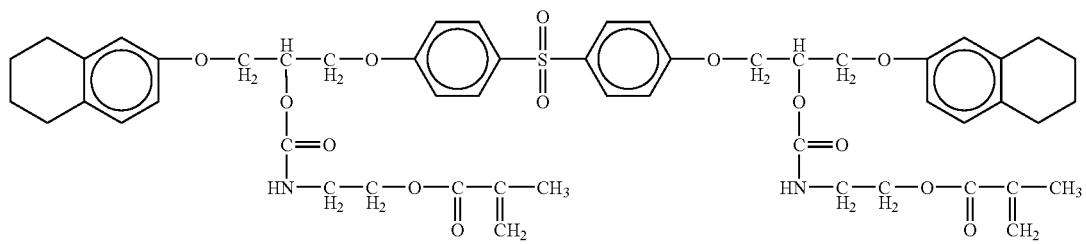
Similarly, the compound (1-11) is specifically the compound represented by the structural formula shown below.
Compound (1-11)
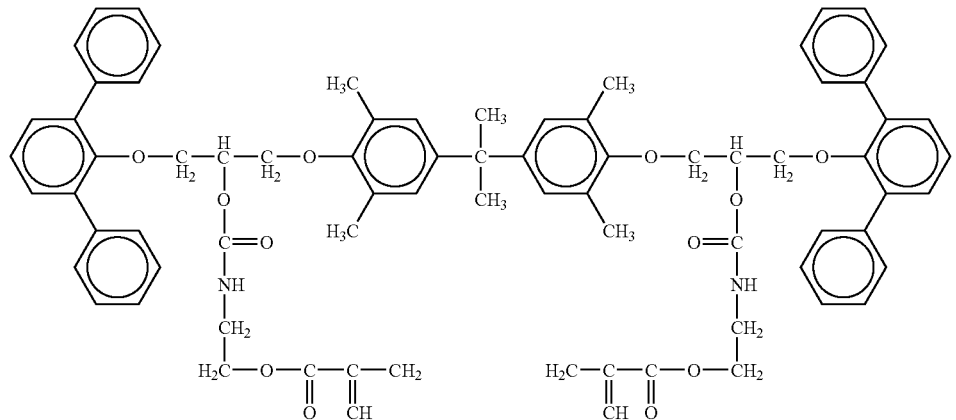
Similarly, the compound (1-12) is specifically the compound represented by the structural formula shown below.
Compound (1-12)
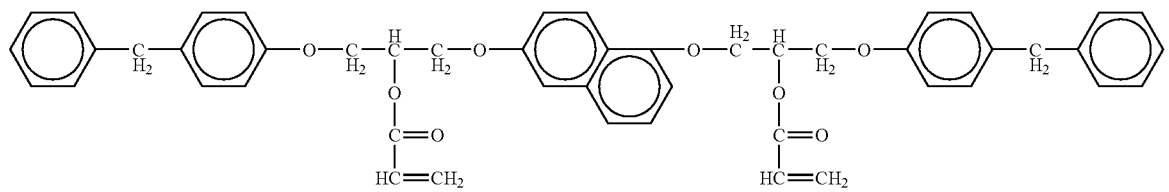

Similarly, the compound (1-13) is specifically the compound represented by the structural formula shown below.

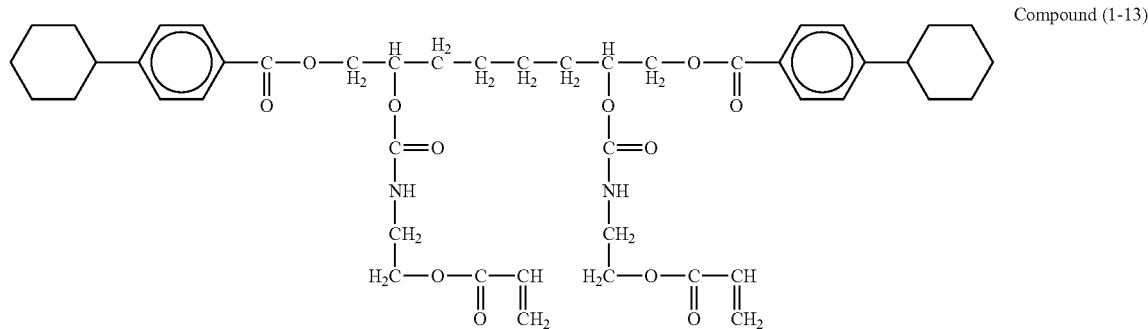

Compound (1-13)

Similarly, the compound (1-14) is specifically the compound represented by the structural formula shown below.

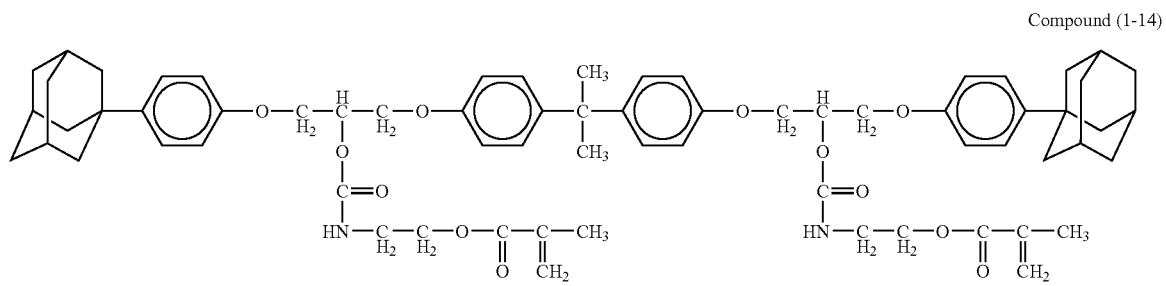

Compound (1-14)

Similarly, the compound (1-15) is specifically the compound represented by the structural formula shown below.

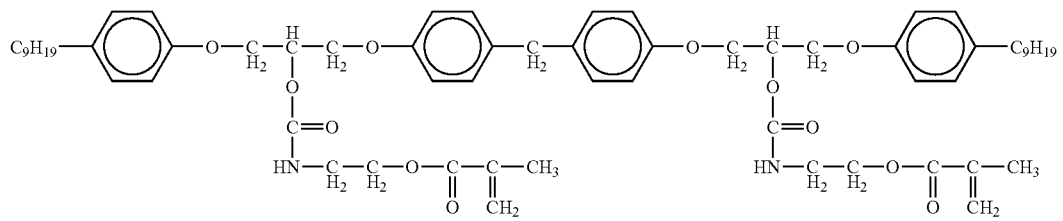

Compound (1-15)

Similarly, the compound (1-16) is specifically the compound represented by the structural formula shown below.

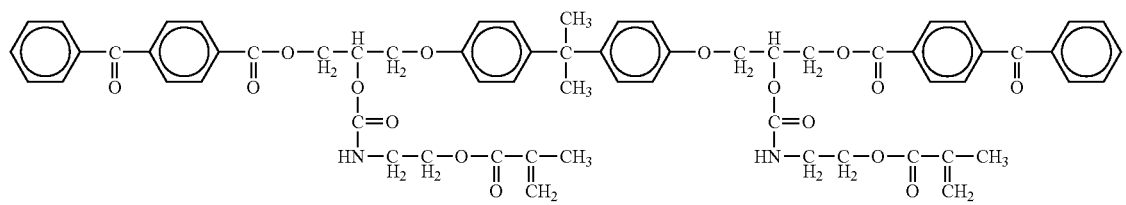

Compound (1-16)

Similarly, the compound (1-17) is specifically the compound represented by the structural formula shown below.
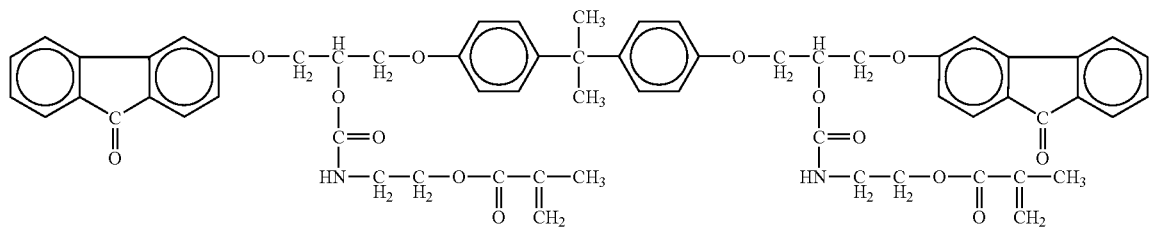
Compound (1-17)
Similarly, the compound (1-18) is specifically the compound represented by the structural formula shown below.
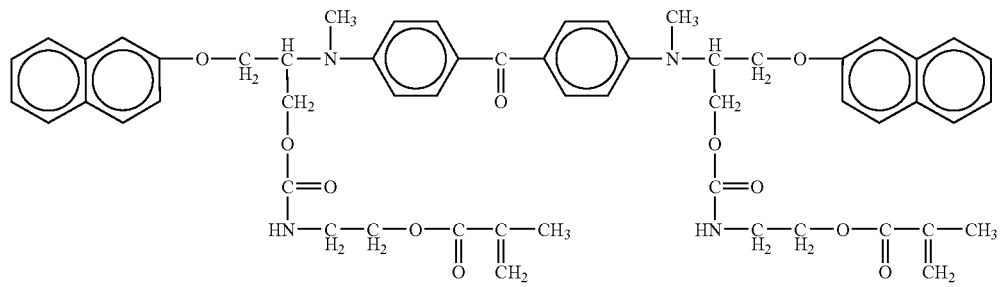
Compound (1-18)
Similarly, the compound (1-19) is specifically the compound represented by the structural formula shown below.
Compound (1-19)
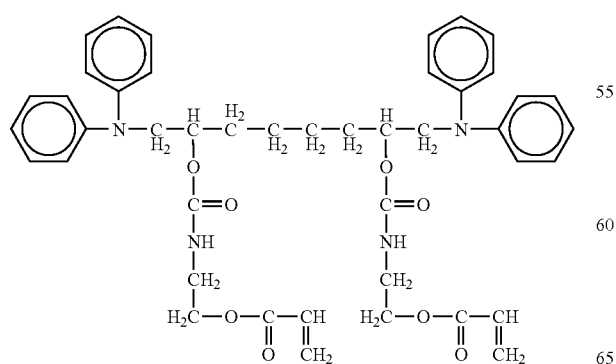

Similarly, the compound (1-20) is specifically the compound represented by the structural formula shown below.

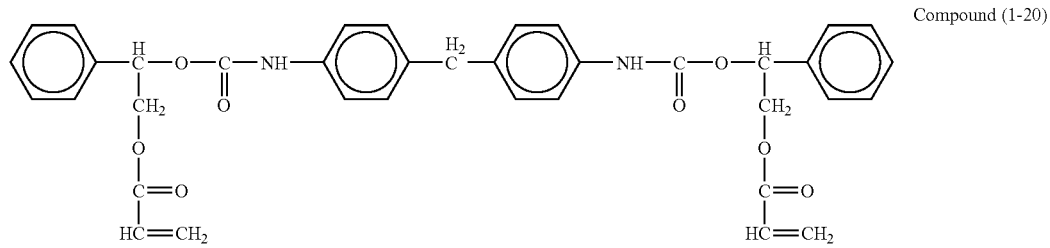

Compound (1-20)

Similarly, the compound (1-21) is specifically the compound represented by the structural formula shown below.

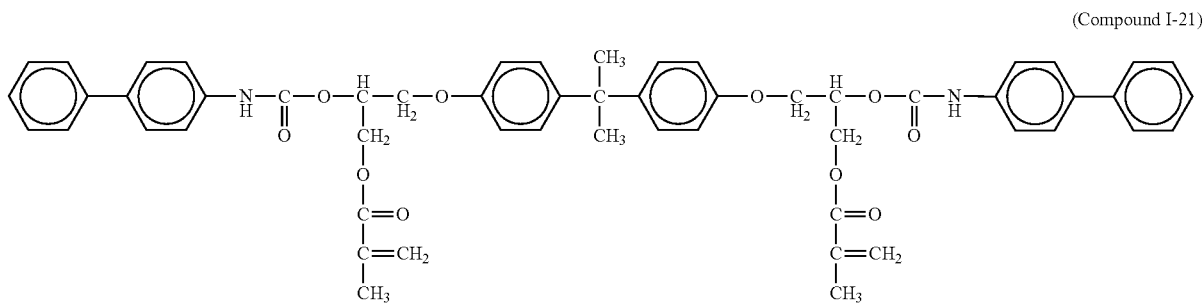

(Compound I-21)

Similarly, the compound (1-22) is specifically the compound represented by the structural formula shown below.

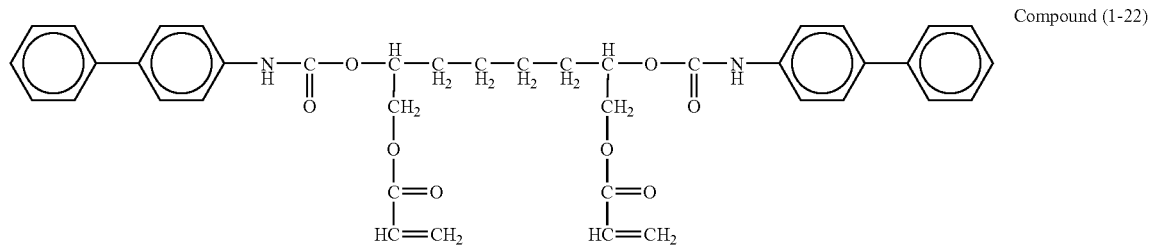

Compound (1-22)

Similarly, the compound (1-23) is specifically the compound represented by the structural formula shown below.

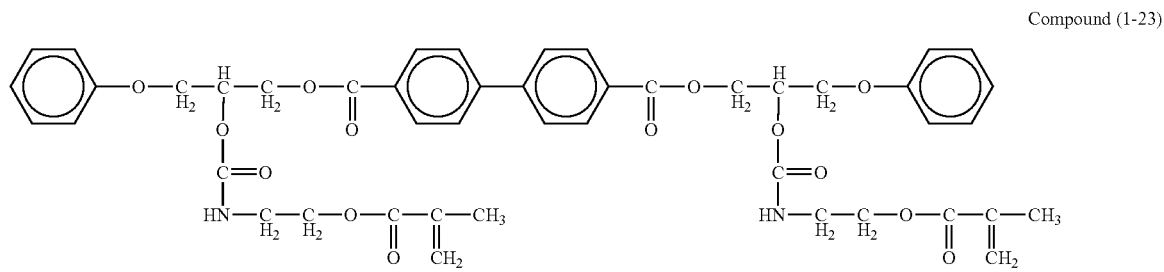

Compound (1-23)

Similarly, the compound (1-24) is specifically the compound represented by the structural formula shown below.

Compound (1-24)

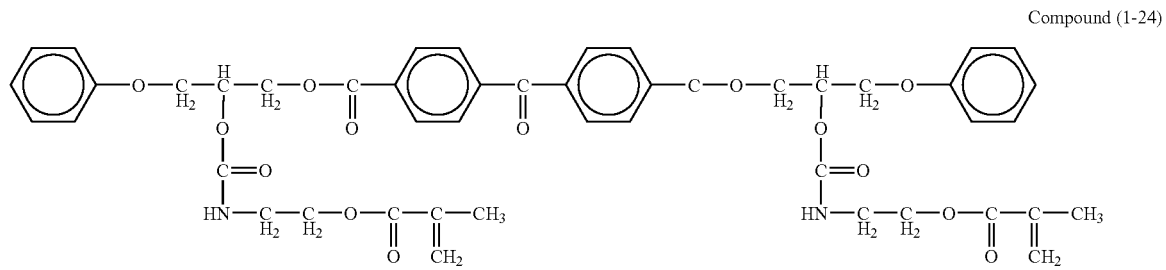

Similarly, the compound (1-25) is specifically the compound represented by the structural formula shown below.

Compound (1-25)

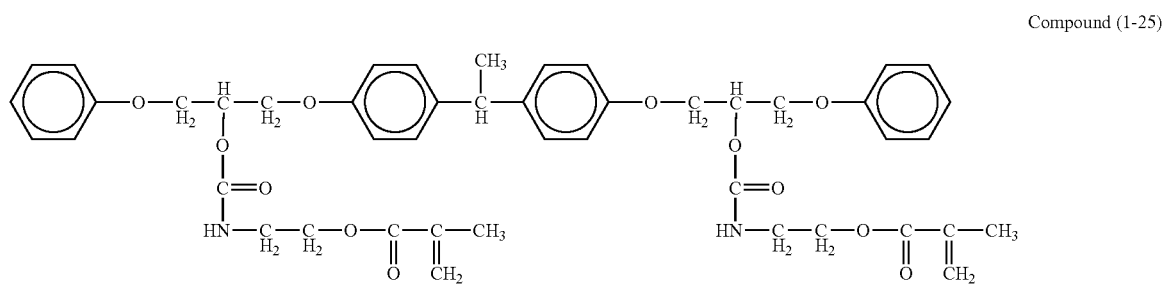

Similarly, the compound (1-26) is specifically the compound represented by the structural formula shown below.

Compound (1-26)

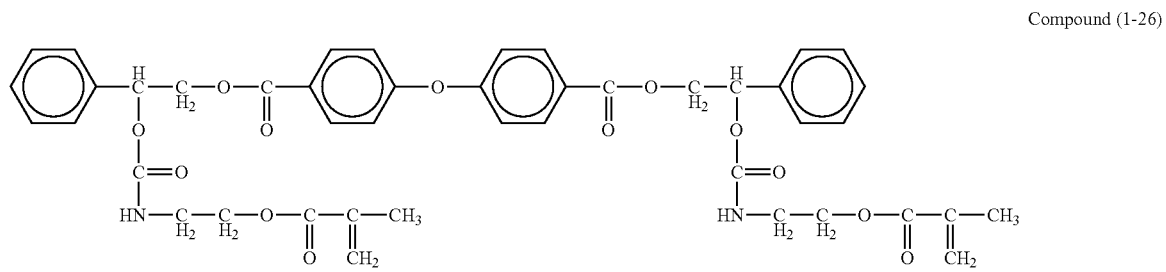

Similarly, the compound (1-27) is specifically the compound represented by the structural formula shown below.

Compound (1-27)

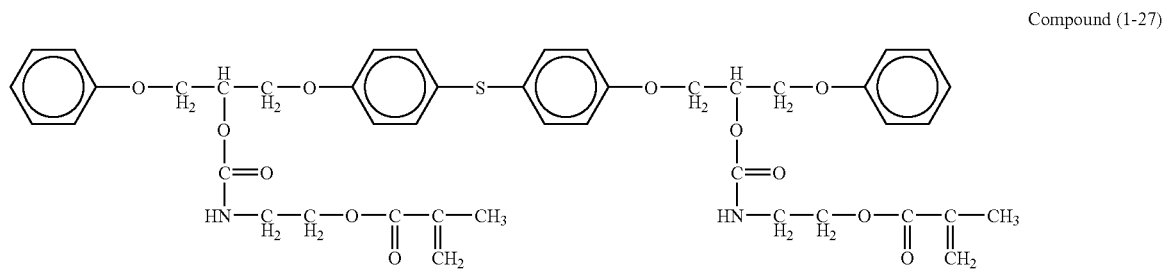

Similarly, the compound (1-28) is specifically the compound represented by the structural formula shown below.

Compound (1-28)

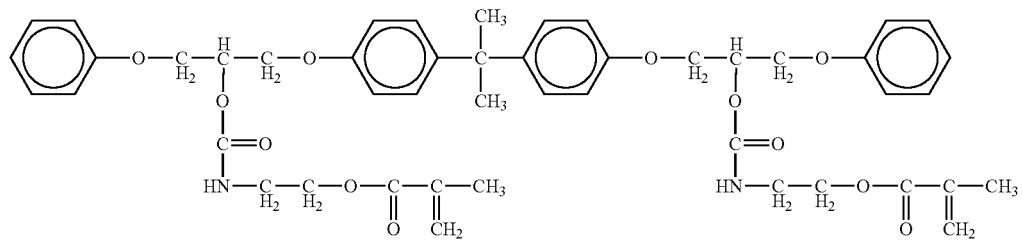

Similarly, the compound (1-29) is specifically the compound represented by the structural formula shown below.

Compound (1-29)

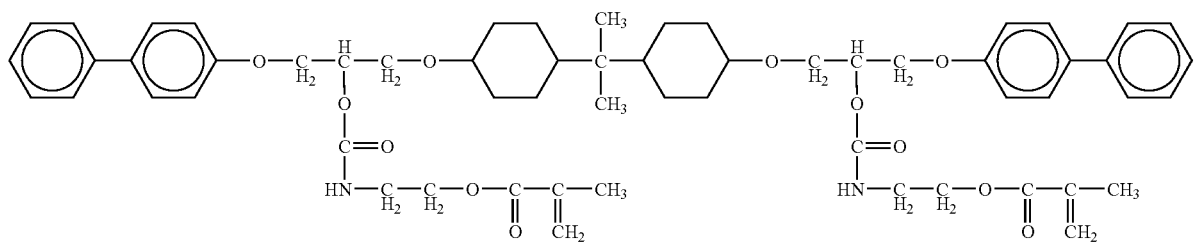

Similarly, the compound (1-30) is specifically the compound represented by the structural formula shown below.

Compound (1-30)

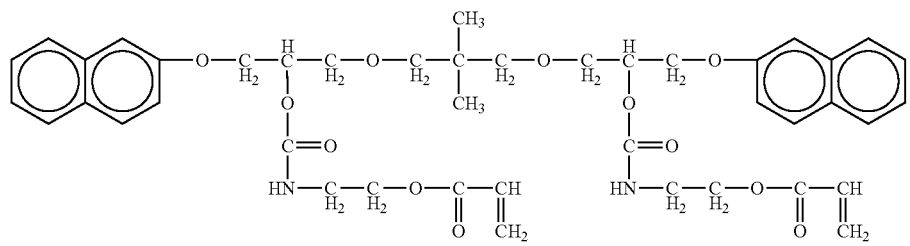

Similarly, the compound (1-31) is specifically the compound represented by the structural formula shown below.

Compound (1-31)

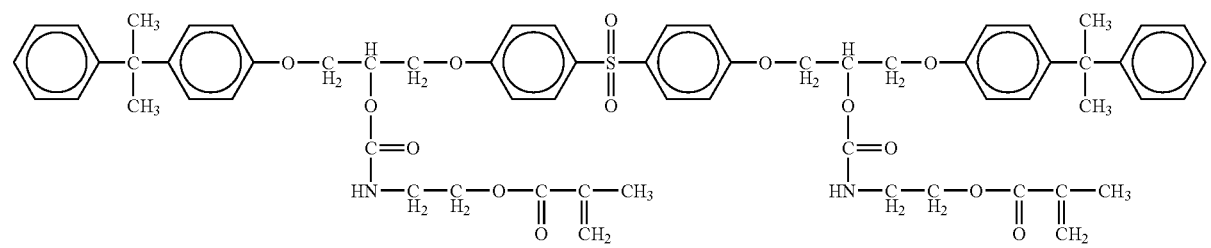

Similarly, the compound (1-32) is specifically the compound represented by the structural formula shown below.

Compound (1-32)

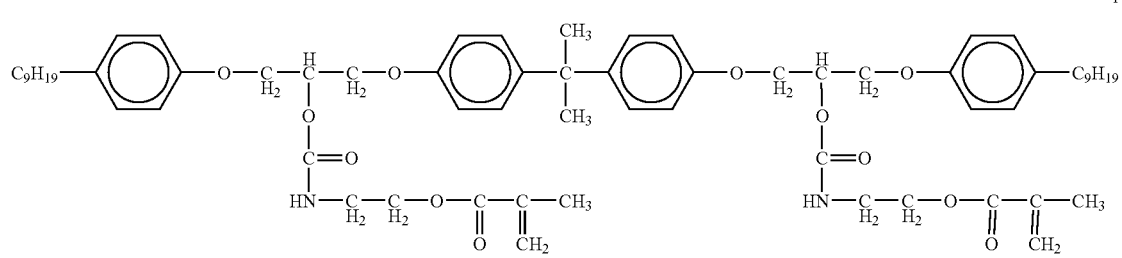

Similarly, the compound (1-33) is specifically the compound represented by the structural formula shown below.

(Compound I-33)

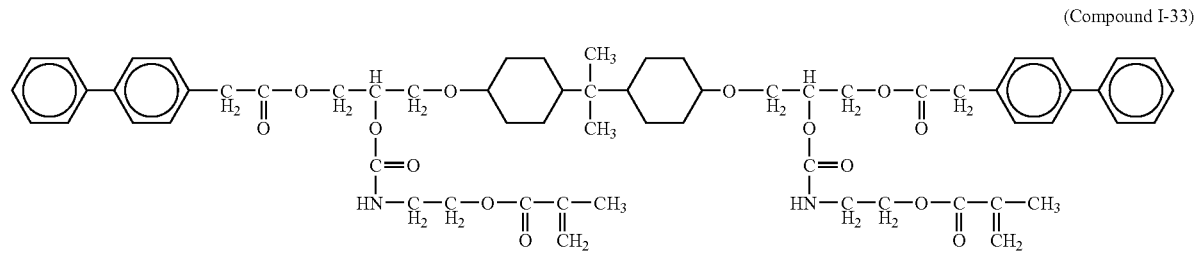

Similarly, the compound (1-34) is specifically the compound represented by the structural formula shown below.

Compound (1-34)

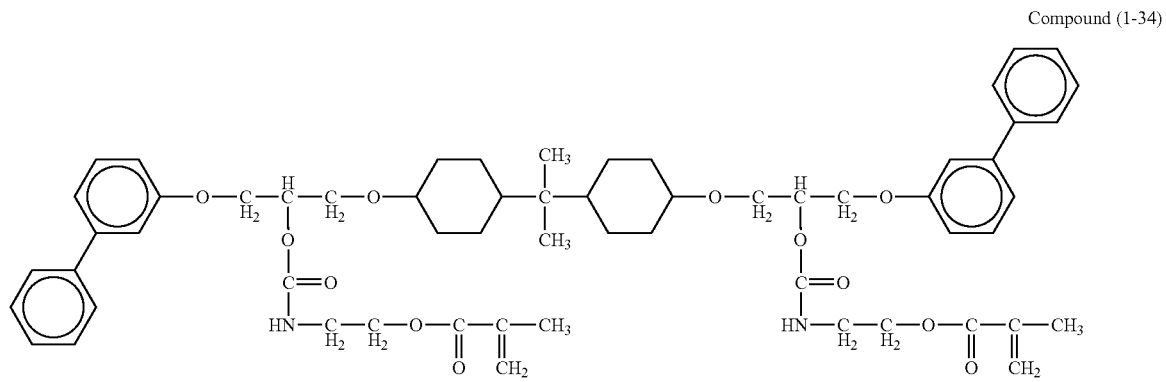

These compounds can be synthesized by a known method such as a transesterification reaction, a urethane reaction or an epoxy addition reaction method using known materials. For example, it is possible to obtain by reacting a compound having a reactive group such as a hydroxy group, a glycidyl group, a carboxy group, or an isocyanate group at both ends of a group represented by —$B^1$— in the general formula (I) with a compound having a group represented by $A^1$- in the general formula (1) and the above reactive group, thereby adding the group $A^1$, and then reacting with a compound having a group represented by $y^6$- in the general formula (4) and the above reactive group, thereby adding the group $y^6$.

These synthesis methods can be appropriately selected according to available materials and are not specifically limited. Of these methods, the urethane reaction method is preferably used since the materials are comparatively easily available and has high reactivity.

As described above, it is anticipated that moisture barrier properties are obtained by $A^1$ and $A^2$ in the general formula (1), namely, a group having a cyclic π-electron conjugated structure in the compound represented by the general formula (1), of the present invention. It is considered that a urethane bond, an ester bond or an ether bond obtained in the production process are less involved in moisture barrier properties.

Therefore, it is preferred to select the synthesis method taking account of ease of availability and reactivity of the materials.

For example, the compound (1-1) can be obtained by adding 4-cumylphenol to bisphenol A diglycidyl ether, followed by a transesterification reaction between the resulting secondary OH and ethyl acrylate.

For example, the compound (1-2) can be obtained by adding 4-phenylbenzoic acid to hydrogenated bisphenol A diglycidyl ether, followed by a urethane reaction of adding methacryloyloxyethyl isocyanate to the resulting secondary OH.

For example, the compound (1-3) can be obtained by a urethane reaction of adding styrene oxide to 2,2-bis(4-hydroxy-3,5-dimethylphenyl)propane and adding methacryloyloxyethyl isocyanate to the resulting secondary OH.

For example, the compound (1-4) can be obtained by adding N-methylaniline to 3,3',5,5'-tetramethylbiphenyl-4,4'-diglycidyl ether, followed by a transesterification reaction between the resulting secondary OH and ethyl acrylate. At this time, $y^4$ is a single bond.

For example, the compound (1-5) can be obtained by adding phenylphenol glycidyl ether to N,N'-dibenzylethylenediamine, followed by a transesterification reaction between the resulting secondary OH and ethyl acrylate.

For example, the compound (1-6) can be obtained by a urethane reaction of adding ECH-modified phenoxyacrylate to dicyclohexylmethane-4,4'-diisocyanate.

For example, the compound (1-7) can be obtained by an epoxy addition reaction of adding 2-naphthol to 3,3',5,5'-tetramethylbiphenyl-4,4'-diglycidyl ether, adding anhydrous succinic acid to the resulting secondary OH, and then adding glycidyl methacrylate to the resulting carboxyl group.

For example, the compound (1-8) can be obtained by adding 2-anthracenecarboxylic acid to naphthalene diglycidyl ether, followed by a urethane reaction of adding methacryloyloxyethyl isocyanate to the resulting secondary OH.

For example, the compound (1-9) can be obtained by adding 9-anthracenecarboxylic acid to neopentyl glycol diglycidyl ether, followed by a transesterification reaction between the resulting secondary OH and ethyl acrylate.

For example, the compound (1-10) can be obtained by a urethane reaction of adding 5,6,7,8-tetrahydro-2-naphthol to bisphenol S diglycidyl ether and adding methacryloyloxyethyl isocyanate to the resulting secondary OH.

For example, the compound (1-11) can be obtained by adding 2,6-dimethylphenol to 3,3',5,5'-tetramethylbiphenyl-4,4'-diglycidyl ether, followed by a urethane reaction of adding methacryloyloxyethyl isocyanate to the resulting secondary OH.

For example, the compound (1-12) can be obtained by adding 4-benzylphenol to naphthalene diglycidyl ether, followed by a transesterification reaction between the resulting secondary OH and ethyl acrylate.

For example, the compound (1-13) can be obtained by adding 4-cyclohexylbenzoic acid to 1,7-octadiene diepoxide, followed by a urethane reaction of adding acryloyloxyethyl isocyanate to the resulting secondary OH.

For example, the compound (1-14) can be obtained by adding bisphenol A diglycidyl ether to 4-(1-adamantyl)phenol, followed by a urethane reaction of adding methacryloyloxyethyl isocyanate to the resulting secondary OH.

For example, the compound (1-15) can be obtained by adding 4-nonylphenol to bisphenol F diglycidyl ether, followed by a urethane reaction of adding methacryloyloxyethyl isocyanate to the resulting secondary OH.

For example, the compound (1-16) can be obtained by adding 4-benzoylbenzoic acid to bisphenol A diglycidyl ether, followed by a urethane reaction of adding methacryloyloxyethyl isocyanate to the resulting secondary OH.

For example, the compound (1-17) can be obtained adding 9-fluorenone-2-carboxylic acid to bisphenol A diglycidyl ether, followed by a urethane reaction of adding methacryloyloxyethyl isocyanate to the resulting secondary OH.

For example, the compound (1-18) can be obtained by adding naphthalene glycidyl ether to 4,4'-bis(methylamino)benzophenone, followed by a urethane reaction of adding methacryloyloxyethyl isocyanate to the resulting primary OH.

For example, the compound (1-19) can be obtained by adding diphenylamine to 1,7-octadiene diepoxide, followed by a urethane reaction of adding acryloyloxyethyl isocyanate to the resulting secondary OH.

For example, the compound (1-20) can be obtained by a urethane reaction of adding ECH-modified phenoxyacrylate to diphenylmethane-4,4'-diisocyanate.

For example, the compound (1-21) can be obtained by adding methacrylic acid to bisphenol A diglycidyl ether, followed by a urethane reaction of adding 4-isocyanatebiphenyl to the resulting secondary OH.

For example, the compound (1-22) can be obtained by adding acrylic acid to 1,7-octadiene diepoxide, followed by a urethane reaction of adding 4-isocyanatebiphenyl to the resulting secondary OH.

For example, the compound (1-23) can be obtained by adding styrene oxide to 4,4'-biphenyldicarboxylic acid, followed by a urethane reaction of adding methacryloyloxyethyl isocyanate to the resulting secondary OH.

For example, the compound (1-24) can be obtained by adding styrene oxide to benzophenone-4,4'-dicarboxylic acid, followed by a urethane reaction of adding methacryloyloxyethyl isocyanate to the resulting secondary OH.

For example, the compound (1-25) can be obtained by adding phenyl glycidyl ether to 4,4'-ethylidenebisphenol, followed by a urethane reaction of adding methacryloyloxyethyl isocyanate to the resulting secondary OH.

For example, the compound (1-26) can be obtained by adding styrene oxide to 4,4'-dicarboxydiphenylether, followed by a urethane reaction of adding methacryloyloxyethyl isocyanate to the resulting secondary OH.

For example, the compound (1-27) can be obtained by adding phenyl glycidyl ether to bis(4-hydroxyphenyl)sulfide, followed by a urethane reaction of adding methacryloyloxyethyl isocyanate to the resulting secondary OH.

For example, the compound (1-28) can be obtained by adding phenyl glycidyl ether to bisphenol A, followed by a urethane reaction of adding methacryloyloxyethyl isocyanate to the resulting secondary OH.

For example, the compound (1-29) can be obtained by adding 4-phenylphenol to hydrogenated bisphenol A diglycidyl ether, followed by a urethane reaction of adding methacryloyloxyethyl isocyanate to the resulting secondary OH.

For example, the compound (1-30) can be obtained by adding 2-naphthol to neopentyl glycol diglycidyl ether, followed by a urethane reaction of adding acryloyloxyethyl isocyanate to the resulting secondary OH.

For example, the compound (1-31) can be obtained by adding 4-α-cumylphenol to bisphenol S diglycidyl ether, followed by a urethane reaction of adding methacryloyloxyethyl isocyanate to the resulting secondary OH.

For example, the compound (1-32) can be obtained by adding 4-nonylphenol to bisphenol A diglycidyl ether, followed by a urethane reaction of adding methacryloyloxyethyl isocyanate to the resulting secondary OH.

For example, the compound (1-33) can be obtained by adding 4-biphenylacetic acid to hydrogenated bisphenol A diglycidyl ether, followed by a urethane reaction of adding methacryloyloxyethyl isocyanate to the resulting secondary OH.

For example, the compound (1-34) can be obtained by adding 2-phenylphenol to hydrogenated bisphenol A diglycidyl ether, followed by a urethane reaction of adding methacryloyloxyethyl isocyanate to the resulting secondary OH.

In Table 1 and Table 2, synthesis methods of the compound (1-1) to the compound (1-34) as an example of specific aspects of the present invention are shown.

The compound represented by the general formula (1), which has a molecular weight of about 500 to 1,500, is preferable since it is excellent in physical properties and workability and is also less likely to be eluted in liquid crystals. It is possible to maintain viscosity suited for use even if a large amount of the compound having the molecular weight within the above range is added in the sealant composition since the compound has comparatively low viscosity.

The amount of the compound represented by the general formula (1) to be added is not specifically limited. The sealant composition can be composed of the compound represented by the general formula (1) with a photopolymerization initiator, and also (meth)acrylate described below can be added so as to control viscosity and to impart interfacial adhesion to the adhered. The amount of the compound represented by the general formula (1) is preferably 30% by mass or more based on the total amount of the sealant composition since the best effect of the present invention is obtained.

The ratio of the sum of the atomic weights of the atoms constituting structures of $A^1$, $A^2$ and $B^1$ to the molecular weight of the compound represented by the general formula (1) shown above is preferably 40% by mass or more since more excellent moisture barrier properties can be obtained.

(Meth)acrylate (Meth)acrylate used in the present invention is not specifically limited as long as it is a known conventional compound having a (meth)acryl group used commonly in the field of UV curing. When used for a liquid crystal panel sealant, those which are not easily miscible with a liquid crystal can be used more preferably. It is preferred to use (meth)acrylates such as pentaacrylate and hexaacrylate of dipentaerythritol, and pentaerythritol tetraacrylate, which are considered to cause large shrinkage upon curing, in a small amount so as to avoid excess shrinkage upon curing. It is preferred to use (meth)acrylate, which enables production of a cured article having a high Tg, since a sealant having excellent heat resistance can be obtained.

In the present invention, (meth)acrylate refers to either or both of methacrylate and acrylate. The (meth)acrylate used in the present invention also includes polyester (meth)acrylate, which has an ester bond in a main chain structure and has at least two (meth)acryl groups, referred to as a "photopolymerizable oligomer" in the field of UV curing; urethane (meth)acrylate having at least one urethane group; epoxy (meth)acrylate obtained by modifying with epichlorohydrin; and (meth)acrylate modified with ethyl oxide, propylene oxide, or cyclic lactone.

Specific examples of the (meth)acrylate used in the present invention include (meth)acrylates having one (meth)acryl group, such as glycerin monomethacrylate (manufactured by NOF CORPORATION under the trade name "BLEMMER GLM"), acroyloxyethyl phthalate (manufactured by KYOEISHA CHEMICAL Co., Ltd. under the trade name "HOA-MPE"), acroyloxyethyl hexahydrophthalate (manufactured by KYOEISHA CHEMICAL Co., Ltd. under the trade name "HOA-HH"), acroyloxyethyl phthalate (manufactured by KYOEISHA CHEMICAL Co., Ltd. under the trade name "HOA-MPL"), benzyl(meth)acrylate (manufactured by OSAKA ORGANIC CHEMICAL INDUSTRY Ltd. under the trade name "BISCOAT # 160"), nonylphenoxypolyethylene glycol acrylates (manufactured by TOAGOSEI CO., Ltd. under the trade names of "ALLONIX M111", "ALLONIX M113", and "ALLONIX M117"), ECH-modified phenoxyacrylate (manufactured by TOAGOSEI CO., Ltd. under the trade name "ALLONIX M5700"), EO-modified succinic acid acrylate (manufactured by KYOEISHA CHEMICAL Co., Ltd. under the trade name "HOA-MS"), and EO-modified phosphoric acid methacrylate (manufactured by KYOEISHA CHEMICAL Co., Ltd. under the trade name "P-1M"); and (meth)acrylates having two or more (meth)acryl groups, such as bis(acryloylethyl)hydroxyethyl isocyanurate (manufactured by TOAGOSEI CO., Ltd. under the trade name "ALLONIX M215"), PO-modified neopentyl glycol diacrylate (manufactured by Sanyo Chemical Industries, Ltd. under the trade name "NA305"), EO-modified bisphenol A diacrylate (manufactured by NOF CORPORATION under the trade name "ADPE-150"), PO-modified bisphenol A diacrylate (manufactured by NOF CORPORATION under the trade name "ADBP-200"), ECH-modified bisphenol A-type acrylate (manufactured by Dainippon Ink and Chemicals, Incorporated under the trade name of "DICLITE UE8200"), ECH-modified phthalic acid diacrylate (manufactured by Nagase Chemicals Ltd. under the trade name "DA-721"), ECH-modified hexahydrophthalic acid diacrylate (manufactured by Nagase Chemicals Ltd. under the trade name "DA-722"), tricyclodecanedimethanol diacrylate (manufactured by Daicel-UCB Co., Ltd. under the trade name "IRR214"), EO-modified phosphoric acid dimethacrylate (manufactured by KYOEISHA CHEMICAL Co., Ltd. under the trade name "P-2M"), tris(acroyloxyethyl)isocyanurate (manufactured by TOAGOSEI CO., Ltd. under the trade name "ALLONIX M315"), dimethylolpropane tetraacrylate (manufactured by TOAGOSEI CO., Ltd. under the trade name "ALLONIX M408"), dipentaerythritol hexaacrylate (manufactured by NIPPON KAYAKU CO., Ltd. under the trade name "KAYARAD DPHA"), and caprolactone-modified dipentaerythritol hexaacrylates (manufactured by NIPPON KAYAKU CO., Ltd. Linder the trade names "KAYARAD DPCA-30" and "KAYARAD DPCA-120").

The amount of the (meth)acrylate is not specifically limited as long as the scope of the present invention is not adversely affected. Specifically, the amount is preferably within a range from 20 to 70% by mass.

Of these (meth)acrylates, a (meth)acrylate having a phosphoric acid group is preferably used since it exhibits high adhesion immediately after photocuring. The amount of the (meth)acrylate having a phosphoric acid group is not specifically limited as long as the scope of the present invention is not adversely affected. Specifically, the amount is preferably with in a range from 0.1 to 10% by mass.

Photopolymerization Initiator

In the photocurable composition for a sealant of the present invention, conventional photopolymerization initiators and photosensitizers can be used, if necessary. Typical examples of the photopolymerization initiator include acetophenone-based compounds such as diethoxyacetophenone and 1-hydroxycyclohexyl-phenyl ketone; benzoin-based compounds such as benzoin and benzoin isopropyl ether; acylphosphine oxide-based compounds such as 2,4,6-trimethylbenzoin-diphenylphosphine oxide; benzophenone-based compounds such as benzophenone and o-benzoylbenzoic acid methyl-4-phenylbenzophenone; thioxanthone-based compounds such as 2,4-dimethylthioxanthone; aminobenzophenone-based compounds such as 4,4'-diethylaminobenzophenone; and polyether-based maleimidecarboxylic acid ester compounds. These compounds can also be used in combination. Examples of the photosensitizer include amines such as triethanolamine and ethyl 4-dimethylaminobenzoate.

The photopolymerization initiator is used in the amount within a range from 0.1 to 15% by mass, and preferably from 0.1 to 8% by mass, based on the total amount of the curable component. When the amount is less than 0.1% by mass, the effect of the photopolymerization initiator is not easily obtained. In contrast, when the amount exceeds 8% by mass, there is a tendency that adhesion decreases and the voltage-holding ratio drastically decreases.

It is more preferred to use a maleimide compound having photopolymerization initiability and photopolymerizability since a photolyte of a photopolymerization initiator or an unreacted photopolymerization initiator, which is causative of a decrease in the voltage-holding ratio, does not remain in the sealed portion. In this case, the maleimide compound and the photopolymerization initiator can be used in combination as long as the voltage-holding ratio does not decrease as a matter of course.

It is preferred to use an initiator having an absorption at a long wavelength at which an absorbance at 365 nm is 50 $M^{-1}cm^{-1}$ or more since reaction inhibition due to light absorption of a cyclic π-electron conjugated structure as $A^1$, $A^2$ can be decreased. Examples of the initiator/sensitizer include IRGACURE 651 (absorption coefficient approximation: 100); IRGACURE 907 (90); LUCIRIN TPO (300); IRGACURE 819 (600); IRGACURE 784 (600); IRGACURE 369 (700); IRGACURE oxe01 (2000); thioxanthones such as 2,4-dimethylthioxanthone, isopropylthioxanthone, and chlorothioxanthon; and a derivative (4000) thereof.

The photocurable composition for a sealant of the present invention shows sufficient adhesive strength when irradiated with light, and a heat radical generator can be used in combination so as to cure the non-exposed portions such as portions under a black matrix by heating.

It is preferred to use, as the heat radical generator, an organic peroxide which does not generate air bubbles. Commonly used organic peroxides can be used and examples thereof include various peroxides such as peroxydicarbonate, peroxyester, peroxyketal, ketone peroxide, and hydroperoxide. These organic peroxides may be used alone, or two or more kinds of them may be used in combination. Alternatively, the organic peroxide may be diluted with a solvent, or may be adsorbed on a powder. It is preferred to use the heat radical generator in an amount of 0.1 to 10% by mass based on the total amount of the composition. When the amount is less than 0.1% by mass, curing upon heating tends to become insufficient. In contrast, when the amount exceeds 10% by mass, the voltage-holding ratio tends to decrease.

The photocurable composition for a sealant of the present invention is cured by a radical polymerization reaction upon irradiation with light and heating, and it is possible to control adhesion of the photocured portion to nearly the same adhesion as that of the thermocured portion and thus the photocurable composition can also be preferably used as a photo-thermocuring type sealant. The photo-thermal curable type sealant can be completely cured to the fine portion where light does not arrive. It is possible to use heat applied in an annealing step of a liquid crystal panel. Shift is not caused by heat and the monomer component is not dissolved in the liquid crystals since the composition has already been photocured, and thus there is no fear of a decrease in the voltage-holding ratio.

Additives

The photocurable composition for a sealant of the present invention can contain, as other components, known conventional silane coupling agents so as to improve adhesion. Of these silane coupling agents, a silane coupling agent having a polymerizable group is particularly preferred since it is copolymerized with the photopolymerizable monomer upon photocuring and thus high adhesion can be obtained. Specific examples of the silane coupling agent having a polymerizable group include vinyltrichlorosilane (KA-1003, Shin-Etsu Chemical Co., Ltd.), 2-(3,4-epoxycyclohexyl)ethyltrimethoxysilane (KBM-303, Shin-Etsu Chemical Co., Ltd.), p-styryltrimethoxysilane (KBM-1403, Shin-Etsu Chemical Co., Ltd.), 3-methacryloxypropylmethyldimethioxysilane (KBM-502, Shin-Etsu Chemical Co., Ltd.), 3-acryloxypropyltrimethoxysilane (KBM-5103, Shin-Etsu Chemical Co., Ltd.), and 3-aminopropyltrimethoxysilane (KBM-903, Shin-Etsu Chemical Co., Ltd.).

To the photocurable composition for a sealant of the present invention, known conventional additives, for example, fillers such as alumina, silica gel, magnesium oxide, and magnesium hydroxide, and polymerization inhibitors can be appropriately added according to the purposes such as adjustment of viscosity and storage stability.

Viscosity

The photocurable composition for a sealanat of the present invention preferably has a viscosity of 10 to 1,000 Pa·s after adjustment. In the case of the photocurable composition for ODF (One prop Filling method: liquid crystal drop method), the viscosity is preferably from 50 to 500 Pa·s.

Method for Production of Liquid Crystal Panel

The photocurable composition for a sealant of the present invention can be used as a liquid crystal sealant. Specifically, it is useful to use as a main sealant in the production of a liquid crystal panel, or use as an end-sealing agent for an injection port after injecting a liquid crystal material into a liquid crystal cell.

The liquid crystal panel can be produced by the following procedure. For example, a photocurable composition for a sealant of the present invention is applied on either a front or back substrate provided with a thin film transistor, a display electrode, an alignment layer, a color filter, or an electrode, laminating the other substrate thereon, and then the surface of the substrate or the side of the substrate is irradiated with light or the substrate is heated, thereby curing the photocurable composition for a sealant of the present invention. Subsequently, liquid crystals are injected into the resulting liquid crystal cell and an injection port is end-sealed with a sealing agent, and thus a liquid crystal panel can be produced.

The liquid crystal panel can also be produced by a so-called ODF method of applying the photocurable composition for a sealant of the present invention on the outer peripheral portion of the surface of one substrate in the form of a frame, dropping liquid crystals therein, and laminating the other substrate thereon, followed by photo-thermocuring.

The photocurable composition for a sealant of the present invention is applied on the surface of the substrate using a dispenser, or a screen printing method. In this case, the photocurable composition is usually applied in a line width of 0.08 to 0.4 mm and a line height of 5 to 50 μm.

Light used to cure the photocurable composition for a sealant of the present invention is preferably ultraviolet light or visible light, of which light having a wavelength of 300 to 450 nm is preferable. As a light source, for example, a high-pressure mercury lamp and a metal halide lamp can be used. Illuminance of the light source is preferably 20 mW/cm$^2$ or more since curing quickly proceeds. When the light quantity is 500 mJ/cm$^2$ or more in terms of integrated light quantity, curing can be satisfactorily conducted. The photocurable composition for a sealant of the present invention shows good photocurability under an air atmosphere. It is more preferred to photocure under an atmosphere of an inert gas such as nitrogen since curing can be conducted with a small integrated light quantity.

When a heat radical generator is used in combination, heating is preferably conducted at 80 to 130° C. for 20 minutes to 2 hours. Particularly, an ODF method (One-Drop Filling method: liquid crystal drop method) can be used so as to further cure the portion cured insufficiently after irradiation with light. It is preferred to simultaneously apply heating upon an annealing step of a liquid crystal panel since the production process can be shortened.

EXAMPLES

The present invention will now be described by way of Examples and Comparative Examples. However, the present invention is not limited thereto. Compound numbers described in Synthesis Examples 1 to 9 are identical to those described in Table 1 and Table 2. Parts and percentages are by weight unless otherwise specified.

Synthesis Example 1

Synthesis of Compound (1-28)

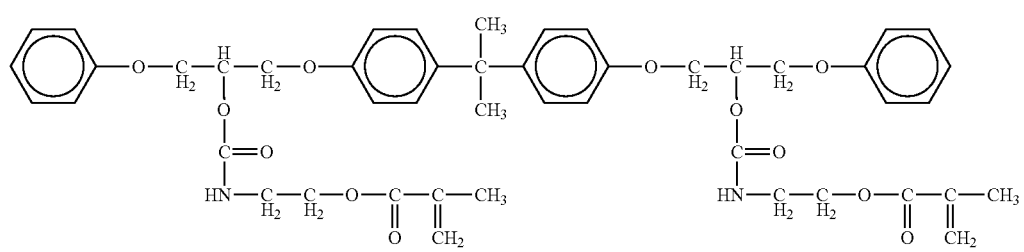

Compound (1-28)

20 parts bisphenol A diglycidyl ether (epoxy equivalent: 171) (Epicron EXA-850CRP, Dainippon Ink and Chemicals, Incorporated) and 11.0 parts of phenol (Tokyo Chemical Industry Co., Ltd.) were reacted under a nitrogen atmosphere at 120° C. for 6 hours using 0.012 parts of tetramethylammonium chloride (Tokyo Chemical Industry Co., Ltd.) as a catalyst to obtain an intermediate in which epoxy and phenol are added. To the resulting intermediate, 0.025 parts of p-methoxyphenol (Wako Pule Chemical Industries, Ltd.) and 0.01 parts of dibutyltin dilaurate (Merck Co.) were added and 18.2 parts of methacryloyloxyethyl isocyanate (Karenz MOI, SHOWA DENKO K.K.) was added dropwise under an air atmosphere at 80° C., followed by stirring for 4 hours to obtain a reaction mixture.

Purification of Compound 20 parts of the reaction mixture was dissolved in 60 parts of warm methanol and, after cooling, a precipitated viscous oily layer was separated. The oily layer was dissolved again in 60 parts of warn methanol and, after cooling, a precipitated viscous oily layer was separated. To the oily material, toluene was added and the residual methanol was removed by distillation under reduced pressure. 1 part of an ion exchanger was added and, after stirring at 40° C. for 2 hours, a deionization treatment was conducted. Then, the ion exchanger was filtered and the toluene was removed under reduced pressure to obtain the purified compound (1-28).

Synthesis Example 2

Synthesis of Compound (1-29))

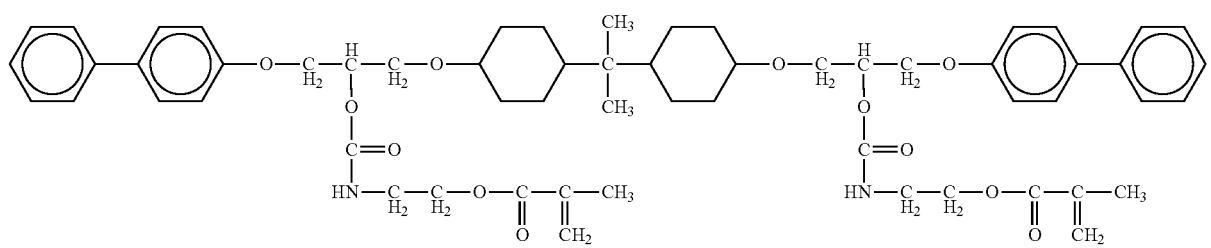

Compound (1-29)

20 parts of hydrogenated bisphenol A diglycidyl ether (epoxy equivalent: 209) (Epicron EXA-7015, Dainippon Ink and Chemicals, Incorporated) and 16.3 parts of 4-phenylphenol (Tokyo Chemical Industry Co., Ltd.) were reacted under a nitrogen atmosphere at 140° C. for 6 hours using 0.016 parts of tetramethylammonium chloride as a catalyst to obtain an intermediate in which epoxy and phenol are added. To the resulting intermediate, 0.03 parts of p-methoxyphenol and 0.01 parts of dibutyltin dilaurate were added. 14.8 parts of methacryloyloxyethyl isocyanate was added dropwise under an air atmosphere at 80° for 4 hour to obtain a reaction mixture. The resulting reaction mixture was purified in the same manner as in Synthesis Example 1 to obtain the compound (1-29).

Synthesis Example 3

Synthesis of Compound (1-1)

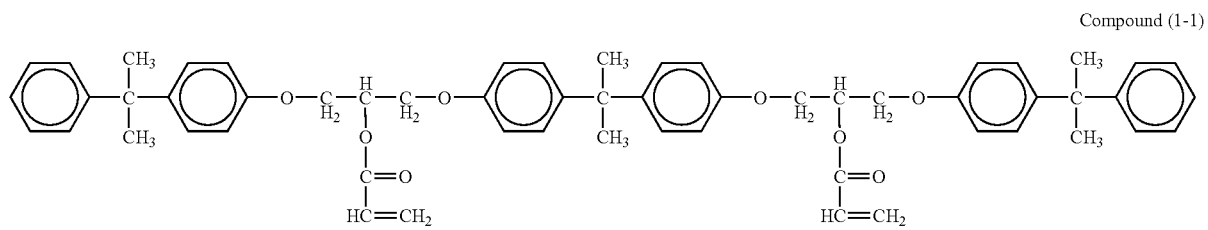

Compound (1-1)

20 parts of bisphenol A diglycidyl ether (Epicron EXA-850CRP, Dainippon Ink and Chemicals, Incorporated) and 24.8 parts of 4-α-cumylphenol (Tokyo Chemical Industry Co., Ltd.) were reacted under a nitrogen atmosphere at 140° C. for 6 hours using 0.018 parts of tetramethylammonium chloride as a catalyst to obtain an intermediate in which epoxy and phenol are added. To the resulting intermediate, 350 parts of ethyl acrylate (Tokyo Chemical Industry Co., Ltd.), 1.76 parts of polystanoxane $ClSn(CH_3)_2OSn(CH_3)_2Cl$ as a catalyst and 3.53 parts of p-methoxyphenol as a polymerization inhibitor were charged, and then the reaction was initiated while introducing air. The reaction was conducted for 30 hours while removing generated ethanol by refluxing with a mixed solution with ethyl acrylate at a reaction temperature of 95 to 100° C.

After completion of the reaction, excess ethyl acrylate was removed by distillation under reduced pressure and a small amount of toluene was added to the residue. Furthermore, excess ethyl acrylate was removed by distillation under reduced pressure to obtain a reaction mixture. The resulting reaction mixture was purified in the same manner as in Synthesis Example 1 to obtain the compound (1-1).

Synthesis Example 4

Synthesis of Compound (1-30)

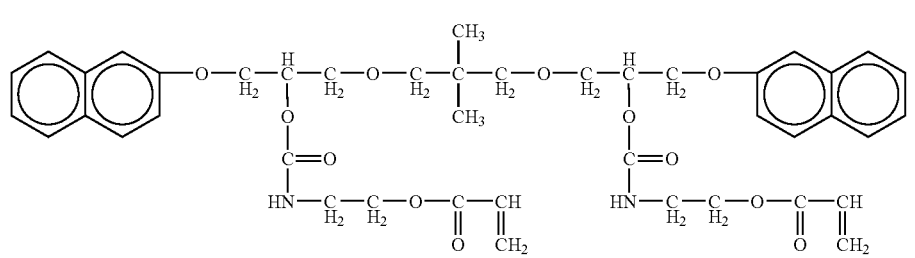

Compound (1-30)

In the same manner as in Synthesis Example 1, except that 20 parts of neopentyl glycol diglycidyl ether (Tokyo Chemical Industry Co., Ltd.) was used in place of bisphenol A diglycidyl ether, 26.7 parts of 2-naphthol (Tokyo Chemical Industry Co., Ltd.) was used in place of phenol, and 26.1 parts of acryloyloxyethyl isocyanate (Karenz AOI, SHOWA DENKO K.K.), was used in place of methacryloyloxyethyl isocyanate, 0.019 parts of tetramethylammonium chloride, 0.036 parts of p-methoxyphenol and 0.015 parts of dibutyltin dilaurate were used, a reaction mixture was obtained. The resulting reaction mixture was purified in the same manner as in Synthesis Example 1 to obtain the compound (1-30).

Synthesis Example 5

Synthesis of Compound (1-31)

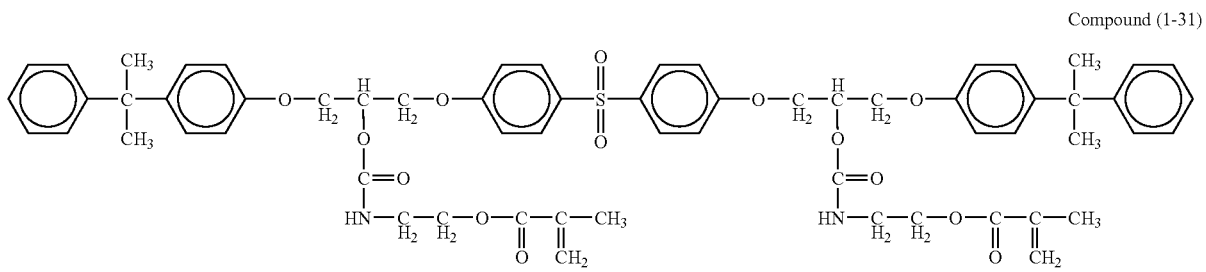

Compound (1-31)

In the same manner as in Synthesis Example 2, except that 20 parts of bisphenol S diglycidyl ether (epoxy equivalent: 296) (Epicron EXA-1415, Dainippon Ink and Chemicals, Incorporated) was used in place of hydrogenated bisphenol A diglycidyl ether, and 14.3 parts of 4-α-cumylphenol was used in place of 4-phenylphenol, 0.014 parts of tetramethylammonium chloride, 0.03 parts of p-methoxyphenol, 0.01 parts of dibutyltin dilaurate and 10.5 parts of methacryloyloxyethyl isocyanate were used, a reaction mixture was obtained. The resulting reaction mixture was purified in the same manner as in Synthesis Example 1 to obtain the compound (1-31)

Synthesis Example 6

Synthesis of Compound (1-32)

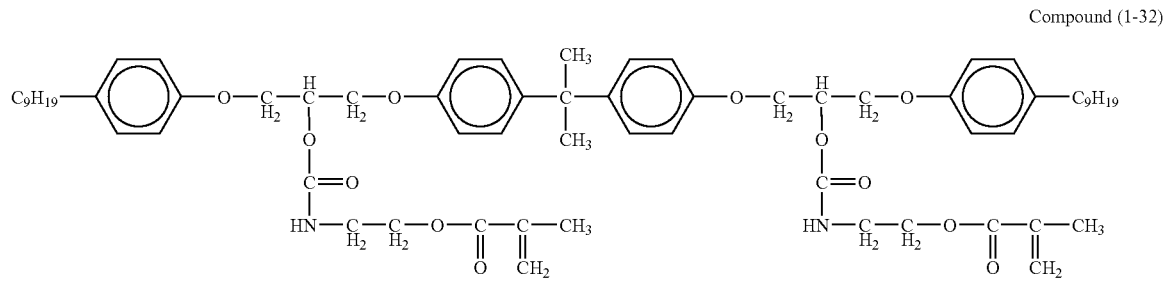

Compound (1-32)

In the same manner as in Synthesis Example 1, except that 20 parts of bisphenol A diglycidyl ether was used, and 25.8 parts of 4-nonylphenol (Tokyo Chemical Industry Co., Ltd.) was used in place of 4-phenylphenol, 0.018 parts of tetramethylammonium chloride, 0.032 parts of p-methoxyphenol, 0.013 parts of dibutyltin dilaurate and 18.2 parts of methacryloyloxyethyl isocyanate were used, a reaction mixture was obtained. The resulting reaction mixture was purified in the same manner as in Synthesis Example 1 to obtain the compound (1-32).

Synthesis Example 7

Synthesis of Compound (1-2))

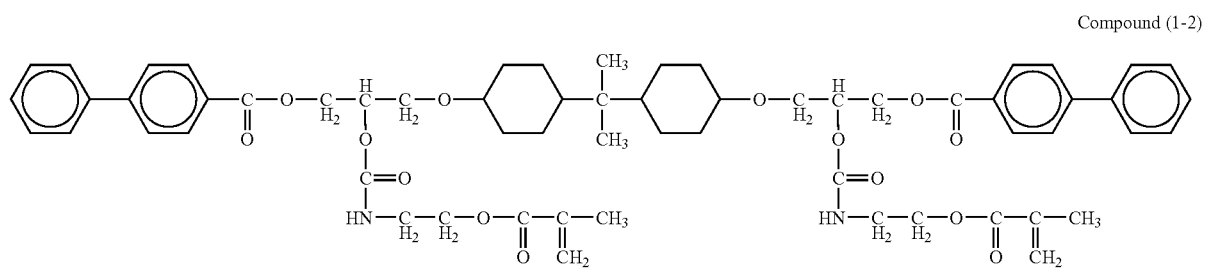

Compound (1-2)

In the same manner as in Synthesis Example 2, except that 20 parts of hydrogenated bisphenol A diglycidyl ether was used, and 19 parts of 4-phenylbenzoic acid (Tokyo Chemical Industry Co., Ltd.) was used in place of 4-phenylphenol, 0.016 parts of tetramethylammonium chloride, 0.03 parts of p-methoxyphenol, 0.01 parts of dibutyltin dilaurate and 14.8 parts of methacryloyloxyethyl isocyanate were used, a reaction mixture was obtained. The resulting reaction mixture was purified in the same manner as in Synthesis Example 1 to obtain the compound (1-2).

Synthesis Example 8

Synthesis of Compound (1-33))

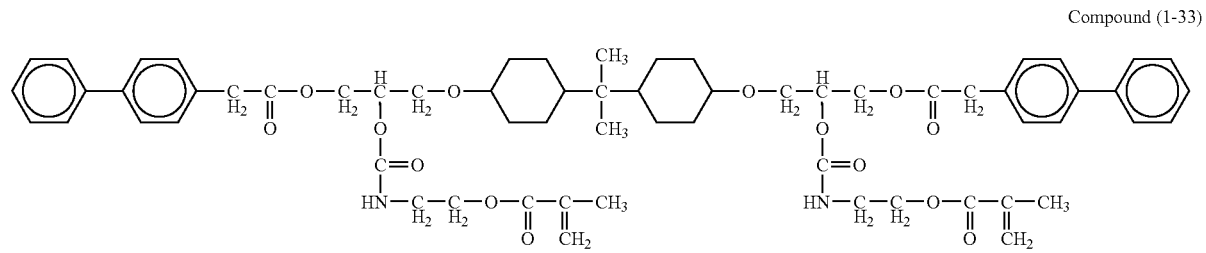

Compound (1-33)

In the same manner as in Synthesis Example 2, except that 20 parts of hydrogenated bisphenol A diglycidyl ether was used, and 20.3 parts of 4-biphenylacetic acid (Tokyo Chemical Industry Co., Ltd.) was used in place of 4-phenylphenol, 0.016 parts of tetramethylammonium chloride, 0.03 parts of p-methoxyphenol, 0.011 parts of dibutyltin dilaurate and 14.8 parts of methacryloyloxyethyl isocyanate were used, a reaction mixture was obtained. The resulting reaction mixture was purified in the same manner as in Synthesis Example 1 to obtain the compound (1-33).

Synthesis Example 9

Synthesis of Compound (1-34)

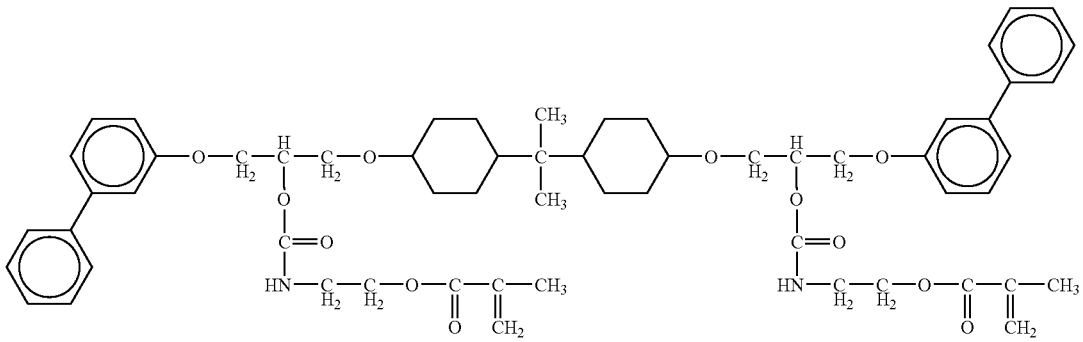

Compound (1-34)

In the same manner as in Synthesis Example 2, except that 2-phenylphenol (Tokyo Chemical Industry Co., Ltd.) was used in place of 4-phenylphenol, a reaction mixture was obtained. The resulting reaction mixture was purified in the same manner as in Synthesis Example 1 to obtain the compound (1-34).

Comparative Synthesis Example 1

Synthesis of Comparative Compound (H-1)

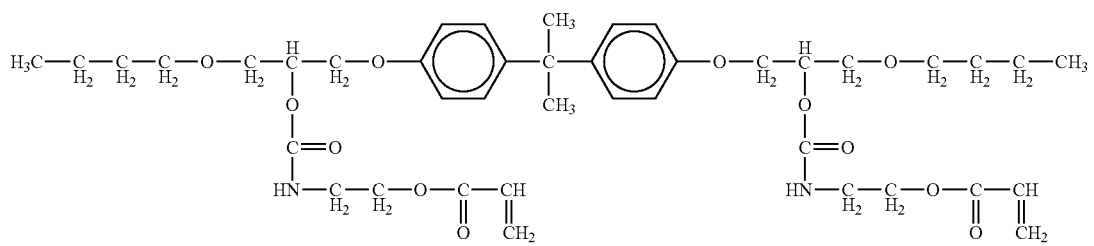

Comparative compound (H-1)

In the same manner as in Synthesis Example 2, except that 20 parts of bisphenol A (Tokyo Chemical Industry Co., Ltd.) was used in place of hydrogenated bisphenol A diglycidyl ether, and 22.9 parts of n-butyl glycidyl ether (Tokyo Chemical Industry Co., Ltd.) was used in place of 4-phenylphenol, 25.0 parts of acryloyloxyethyl isocyanate was used was used in place of methacryloyloxyethyl isocyanate, 0.011 parts of tetramethylammonium chloride, 0.03 parts of p-methoxyphenol, and 0.02 parts of dibutyltin dilaurate were used, a reaction mixture was obtained. The resulting reaction mixture was purified in the same manner as in Synthesis Example 1 to obtain the comparative compound (H-1).

Comparative Synthesis Example 2

Synthesis of Comparative Compound (H-2)

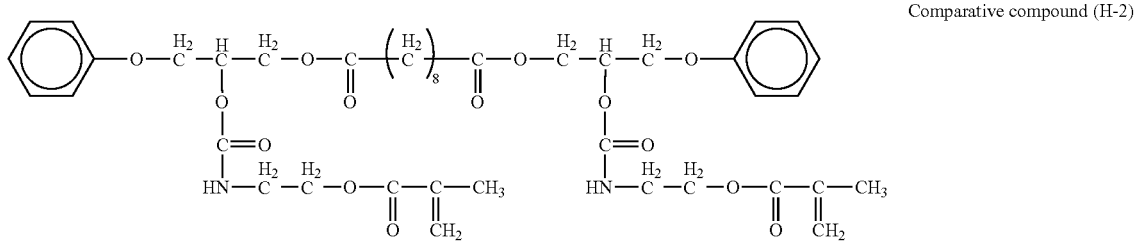

Comparative compound (H-2)

In the same manner as in Synthesis Example 1, except that 20 parts of sebacic acid (Tokyo Chemical Industry Co., Ltd.) was used in place of bisphenol A diglycidyl ether, and 29.7 parts of glycidyl phenyl ether (Tokyo Chemical Industry Co., Ltd.) was used in place of phenol, 0.02 parts of tetramethylammonium chloride, 0.04 parts of p-methoxyphenol, 0.016 parts of dibutyltin dilaurate and 30.7 parts of methacryloyloxyethyl isocyanate were used, a reaction mixture was obtained. The resulting reaction mixture was purified in the same manner as in Synthesis Example 1 to obtain the comparative compound (H-2).

Measurement of Adhesion

A spherical spacer having an average particle diameter of about 9 μm "Micropearl SP-209" manufactured by SEKISUI CHEMICAL CO., LTD. and 0.01 to 0.02 g of a photocurable composition for a sealant described hereinafter were applied at the center of a glass plate having a thickness of 2.7 mm and a size of 76×26 mm manufactured by Matsunami Glass Ind., Ltd., and then another glass plate was laid thereon so as to form a cross shape. Under an air atmosphere, the glass plates were irradiated with 50 mW/cm$^2$ of ultraviolet rays for 40 seconds using a high-pressure mercury lamp and then heated to 120° C. as a liquid crystal annealing temperature for 60 minutes to obtain an evaluation sample having an adhesion area of 0.2 to 0.4 cm$^2$. The glass plates of the laminated evaluation sample were pulled from above and below in a direction perpendicular to the adhesion surface at a rate of 10 mm/min, and then a force (N) required to fracture the adhesive portion between the glass substrates was measured and was evaluated by a force (MPa) per unit area.

Measurement of Moisture Permeability

Moisture barrier properties were evaluated in conformity with JIS Z-0208. The amount of moisture (g/m$^2$·24 hours) permeated through a sealant for 24 hours under the conditions of 40° C. and relative humidity of 90% was measured. The sealant used was a sealant obtained by applying a photocurable composition for a sealant described hereinafter on a substrate in a thickness of about 200 μm using an applicator, and irradiating with 25 mW/cm$^2$ of ultraviolet rays for 200 seconds under a nitrogen atmosphere using a high-pressure mercury lamp.

Measurement of Tg

A photocurable composition for a sealant described hereinafter was applied on a substrate in a thickness of about 200 μm using an applicator, and was irradiated with 250 mW/cm$^2$ of ultraviolet rays for 200 seconds under a nitrogen atmosphere using a high-pressure mercury lamp to obtain a sample. The resulting sample was measured by a viscoelastoineter "Solid Analyzer RSAII" (frequency: 1 Hz, heated at a rate of 5° C./min) manufactured by Rheometrics Co. and the temperature at which tan δ represented by loss elastic modulus/storage elastic modulus becomes a maximum was taken as the Tg.

Example 1

60 parts of a monomer represented by the compound (1-28) obtained in Synthesis Example 1, 25 parts of an EO-modified bisphenol F diacrylate (ALLONIX M-208, TOAGOSEI CO., Ltd.), 1 part of an EO-modified phosphoric acid dimethacrylate (P-2M, NIPPON KAYAKU CO., Ltd.), 10 parts of 2-acryloyloxyethyl hexahydrophthalate (HOAHH, KYOEISHA CHEMICAL Co., Ltd.), 2 parts of benzyl dimethyl ketal (IRGACURE 651, Ciba Specialty Chemicals Inc.), 0.5 parts of 2-isopropylthioxanthone (ITX, Nihon SiberHegner K.K.), 2 parts of acryloyloxypropyltrimethoxysilane (Shin-Etsu Chemical Co., Ltd. under the trade name "KBM5103"), 2 parts of t-butyl peroxybenzoate (Perbutyl Z, NOF CORPORATION) and 3 parts of silica as a filler were stirred at 80° C. and then degassed to obtain a photocurable composition for a sealant. The composition was evaluated in accordance with the above evaluation procedures. The results are shown in Table 3.

Example 2

50 parts of a monomer represented by the compound (1-29) obtained in Synthesis Example 2, 20 parts of an ECH-modified phthalic acid diacrylate (Denacol Acrylate DA-721, KYOEISHA CHEMICAL Co., Ltd.), 15 parts of 2-acryloyloxyethyl hexahydrophthalate (HOAHH, KYOEISHA CHEMICAL Co., Ltd.), 10 parts of tricyclodecanedimethanol diacrylate (IRR214, Daicel-UCB Co., Ltd.), 2 parts of benzyl dimethyl ketal, 0.5 parts of 2-isopropylthioxanthone (ITX, Nihon SiberHegner K.K.), 3 parts of acryloyloxypropyltrimethoxysilane, 2 parts of t-butyl peroxybenzoate (Perbutyl Z, NOF CORPORATION) and 3 parts of silica as a filler were stirred at 80° C. and then degassed to obtain a photocurable composition for a sealant. The composition was evaluated in accordance with the above evaluation procedures. The results are shown in Table 3.

Example 3

In the same manner as in Example 1, except that the compound (1-28) in Example 1 was replaced by the compound (1-29), a sealant was obtained and evaluated in accordance with the above evaluation procedures. The results are shown in Table 3.

Example 4

In the same manner as in Example 1, except that the compound (1-28) in Example 1 was replaced by the compound (1-1), a sealant was obtained and evaluated in accordance with the above evaluation procedures. The results are shown in Table 3.

Example 5

In the same manner as in Example 1, except that the compound (1-28) in Example 1 was replaced by the compound (1-30), a sealant was obtained and evaluated in accordance with the above evaluation procedures. The results are shown in Table 3.

Example 6

In the same manner as in Example 1, except that the compound (1-28) in Example 1 was replaced by the compound (1-31), a sealant was obtained and evaluated in accordance with the above evaluation procedures. The results are shown in Table 3.

Example 7

In the same manner as in Example 1, except that the compound (1-28) in Example 1 was replaced by the compound (1-32), a sealant was obtained and evaluated in accordance with the above evaluation procedures. The results are shown in Table 3.

Example 8

In the same manner as in Example 1, except that the compound (1-28) in Example 1 was replaced by the compound (1-2), a sealant was obtained and evaluated in accordance with the above evaluation procedures. The results are shown in Table 3.

Example 9

In the same manner as in Example 1, except that the compound (1-28) in Example 1 was replaced by the compound (1-33), a sealant was obtained and evaluated in accordance with the above evaluation procedures. The results are shown in Table 3.

Example 10

In the same manner as in Example 1, except that the compound (1-28) in Example 1 was replaced by the compound (1-34), a sealant was obtained and evaluated in accordance with the above evaluation procedures. The results are shown in Table 3.

Comparative Example 1

In the same manner as in Example 1, except that the compound (1-28) in Example 1 was replaced by the comparative compound (H-1), a sealant was obtained and evaluated in accordance with the above evaluation procedures. The results are shown in Table 3.

Comparative Example 2

In the same manner as in Example 1, except that the compound (1-28) in Example 1 was replaced by the comparative compound (H-2), a sealant was obtained and evaluated in accordance with the above evaluation procedures. The results are shown in Table 3.

Comparative Example 3

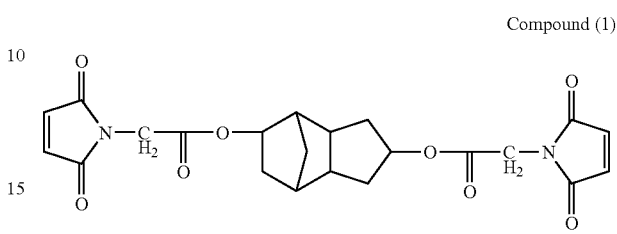

Compound (1)

25 parts of a maleimide compound represented by the compound (I), 22 parts of a urethane acrylate (manufactured by Daicel-UCB Co., Ltd. under the trade name "EB4866") which has an isophorone ring and also has three acryloyl groups in a molecule, 35 parts of tricyclodecane monoacrylate (manufactured by Hitachi Chemical Co., Ltd. under the trade name "FA513A"), 16 parts of 2-acryloyloxyethyl hexahydrophthalate (manufactured by KYOEISHA CHEMICAL Co., Ltd. under the trade name "LIGHT-ACRYLATE HOAHH") and 2 parts of acryloyloxypropyltrimethoxysilane (Shin-Etsu Chemical Co., Ltd. under the trade name "KBM5103") were stirred at 60° C. and then degassed to obtain a photocurable composition for a sealant. The composition was evaluated in accordance with the above evaluation procedures. The results are shown in Table 3.

Comparative Example 4

60 parts of a PO 4 mol-inodified bisphenol A diacrylate (BP-4PA, KYOEISHA CHEMICAL Co., Ltd.), 25 parts of an EO-modified bisphenol F diacrylate (ALLONIX M-208, TOAGOSEI CO., Ltd.), 1 part of an EO-modified phosphoric acid dimethacrylate (P-2M, NIPPON KAYAKU CO., Ltd.), 10 parts of 2-acryloyloxyethyl hexahydrophthalate (HOAHH, KYOEISHA CHEMICAL Co., Ltd.), 2 parts of benzyl dimethyl ketal (IRGACURE 651, Ciba Specialty Chemicals Inc.), 0.5 parts of 2-isopropythioxanthione (ITX, Nihon SiberHegner K.K.), 2 parts of acryloyloxypropyltrimethoxysilane (Shin-Etsu Chemical Co., Ltd. under the trade name "KBM5103"), 2 parts of t-butyl peroxybenzoate (Perbutyl Z, NOF CORPORATION) and 8 parts of silica as a filler were stirred at 80° C. and then degassed to obtain a photocurable composition for a sealant. The composition was evaluated in accordance with the above evaluation procedures. The results are shown in Table 3.

TABLE 3

|  | Adhesion (MPa) | Moisture Permeability (g/m²day) | Tg (° C.) |
|---|---|---|---|
| Example 1 | 8.0 | 8.5 | 125 |
| Example 2 | 6.0 | 8.5 | 120 |
| Example 3 | 7.0 | 5.5 | 127 |
| Example 4 | 8.0 | 7.0 | 125 |
| Example 5 | 8.0 | 6.5 | 124 |
| Example 6 | 7.0 | 8.0 | >130 |
| Example 7 | 6.0 | 7.5 | 130 |
| Example 8 | 7.5 | 6.5 | 133 |
| Example 9 | 6.0 | 5.0 | 131 |

TABLE 3-continued

| | Adhesion (MPa) | Moisture Permeability (g/m²day) | Tg (°C.) |
|---|---|---|---|
| Example 10 | 7.0 | 6.5 | 120 |
| Comparative Example 1 | 6.0 | 12.5 | 116 |
| Comparative Example 2 | 5.0 | 13.0 | 113 |
| Comparative Example 3 | 1.5 | 5.5 | >130 |
| Comparative Example 4 | 6.0 | 14.5 | 120 |

As a result, all compositions for a sealant of Examples 1 to 10 showed adhesion of 6 MPa or more and moisture permeability of 10 g/m² day or less, and also had both high adhesion and high moisture resistance. In contrast, Comparative Example 1 is an example in which $A^1$ and $A^2$ in the general formula (1) do not a cyclic π-electron conjugated structure and showed poor moisture resistance. Comparative Example 2 is an example in which $B^1$ is an aliphatic hydrocarbon group of 8 carbon atoms and also showed poor moisture resistance. Comparative Example 3 is an example in which a maleimide compound having an alicyclic structure is used, and was excellent in moisture resistance but was inferior in adhesion. Comparative Example 4 is an example in which bisphenol A diacrylate, which is widely used as a sealant, was used, but was inferior in moisture resistance.

INDUSTRIAL APPLICABILITY

The present invention is used as a sealant or an end-sealing agent of panels such as a liquid crystal panel, an organic EL display panel, and an electronic paper, and is also used for other applications to which moisture resistance is required, for example, an end-sealing agent of a semiconductor, a sealant of a dry battery, an optical disk coating agent, an adhesive for an optical disk, a material for an optical material, an adhesive for an optical material, a surface coating agent of a food packaging sheet, or a material for a moisture barrier film.

The invention claimed is:

1. A photocurable composition for a liquid crystal sealant, comprising a phosphoric acid (meth)acrylate and a compound represented by formula (1):

$$A^1\text{-}Y^1\text{—}B^1\text{—}Y^2\text{-}A^2 \quad (1)$$

wherein $A^1$ and $A^2$ each represents, independently, a monovalent group having a cyclic π-electron conjugated structure;

$Y^1$ and $Y^2$ each represents, independently, a divalent group represented by formula (4):

(4)

wherein $y^1$ and $y^2$ represent a linking group selected from a single bond, an ester bond, a urethane bond, and —NR—, wherein R represents an alkyl group of 1 to 4 carbon atoms, or a benzyl group, or a group in which one of the linking group and one of an alkylene group of 1 to 2 carbon atoms are linked, wherein the alkylene group is bonded to $A^1$ or $A^2$, in which $y^1$ is bonded to $A^1$ or $A^2$ and $y^2$ is bonded to $B^1$, $y^3$ represents an alkyltriyl group of 1 to 3 carbon atoms, $y^4$ represents a single bond, an ether bond, an ester bond, or a urethane bond, $y^5$ represents a single bond, an alkylene group of 1 to 5 carbon atoms, or an oxyalkylene group of 1 to 6 carbon atoms, wherein 2 to 4 oxyalkylene groups may be contiguous, or a phenylene group, wherein $y^4$ is invariably a single bond when $y^5$ is a single bond, and $y^6$ represents a polymerizable group selected from the group consisting of a (meth)acryloyl group, a (meth)acryloyloxy group, a (meth)acrylamide group, a vinyl group, and a vinyloxy group; and $B^1$ represents (i) a divalent alicyclic hydrocarbon group, (ii) a divalent aromatic hydrocarbon group, (iii) a divalent heterocyclic group, (iv) a divalent aliphatic hydrocarbon group of 1 to 6 carbon atoms, or (v) a divalent group in which two or more groups selected from the group consisting of a divalent alicyclic hydrocarbon group, a divalent aromatic hydrocarbon group, a divalent heterocyclic group, a divalent aliphatic hydrocarbon group of 1 to 6 carbon atoms, a carbonyl group, an ether group, a thioether group, and a $SO_2$ group are linked.

2. The photocurable composition for the liquid crystal sealant according to claim 1, wherein in the formula (1), $A^1$ and $A^2$ each represents, independently, a monovalent group of a condensed ring structure composed of 2 to 4 rings, wherein the ring constituting the condensed ring is an aromatic ring, a heterocyclic ring, or an alicyclic ring of 3 to 10 carbon atoms), or a group represented by formula (3):

(3)

wherein $a^2$ represents a single bond or an alkylene group of 1 to 10 carbon atoms, $a^3$ represents a hydrogen atom, an aromatic hydrocarbon group of 6 to 12 carbon atoms, an aromatic heterocyclic group of 6 to 12 carbon atoms, or an alicyclic hydrocarbon group of 3 to 10 carbon atoms, and m represents an integer from 1 to 2; and $B^1$ represents a divalent alicyclic hydrocarbon group of 3 to 10 carbon atoms, a divalent aromatic hydrocarbon group of 6 to 20 carbon atoms, an alkylene group of 1 to 6 carbon atoms, or a structure represented by -$b^1$-$b^2$-$b^3$- wherein $b^1$ and $b^3$ represent a divalent alicyclic hydrocarbon group of 3 to 10 carbon atoms or a divalent aromatic hydrocarbon group of 6 to 12 carbon atoms, and $b^2$ represents a single bond, an alkylene group of 1 to 6 carbon atoms, a carbonyl group, an ether group, a thioether group, or a $SO_2$ group.

3. The photocurable composition for the liquid crystal sealant according to claim 1, wherein in the formula (1), $A^1$ and $A^2$ each represents, independently, a group selected from structural formulas A-1 to A-23 shown below:

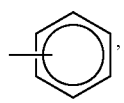

A-1

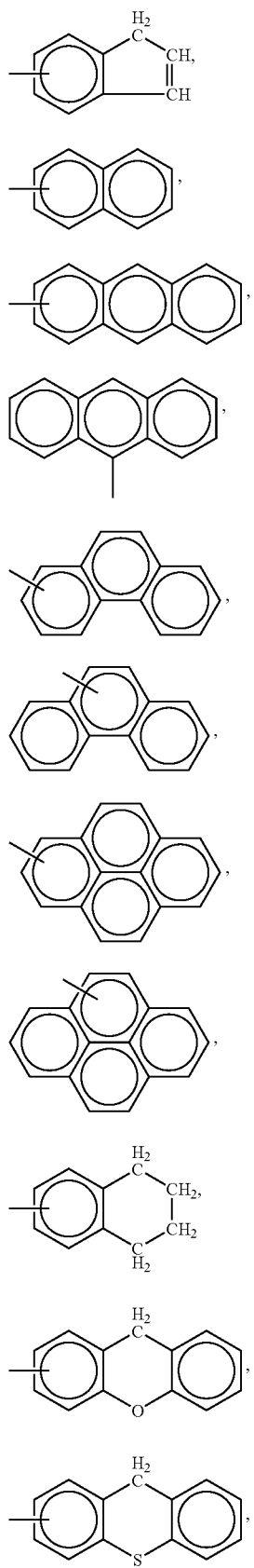
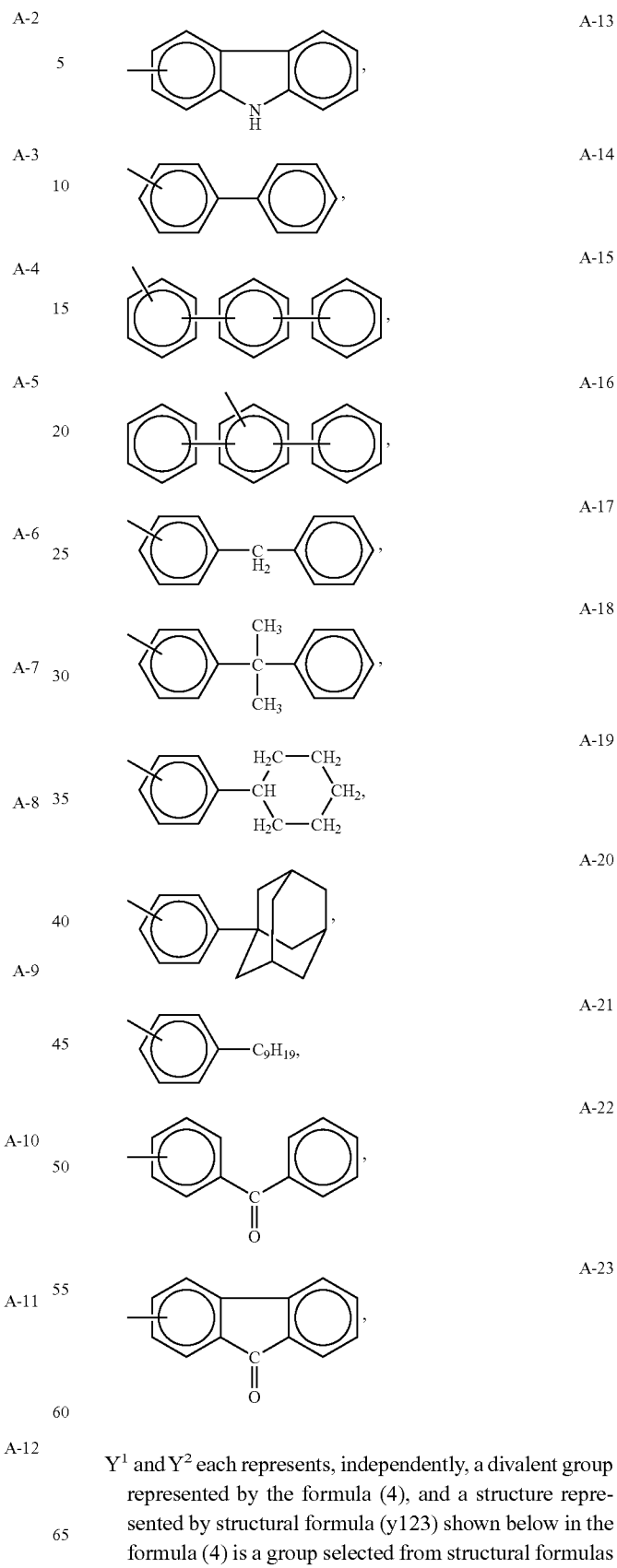
$Y^1$ and $Y^2$ each represents, independently, a divalent group represented by the formula (4), and a structure represented by structural formula (y123) shown below in the formula (4) is a group selected from structural formulas y-1 to y-31 shown below:

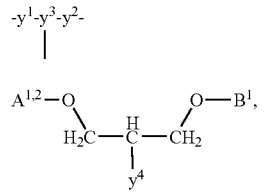
-y¹-y³-y²-
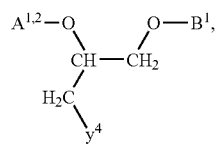 y-1
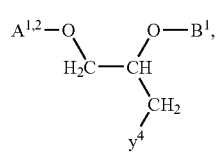 y-2
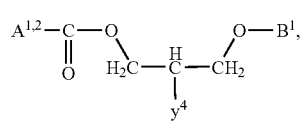 y-3
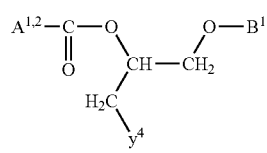 y-4
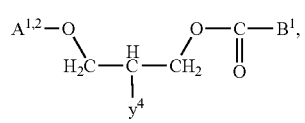 y-5
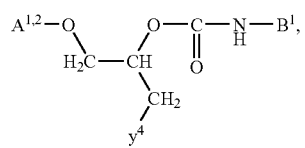 y-6
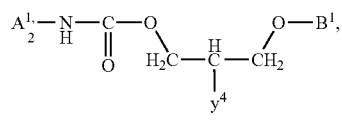 y-7
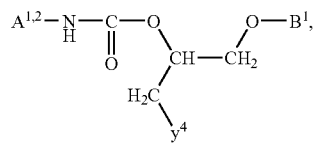 y-8
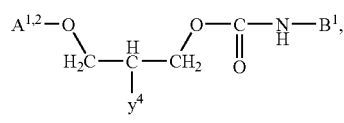 y-9
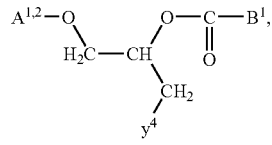 y-10
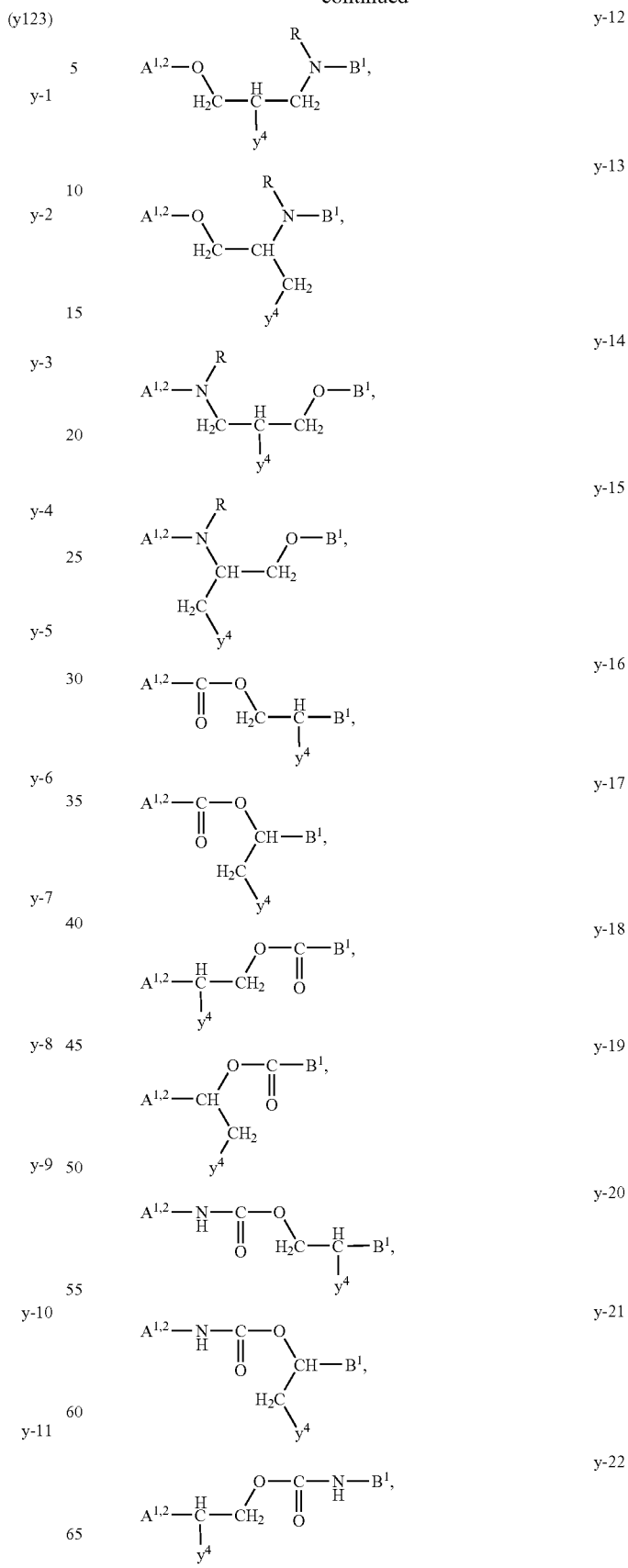

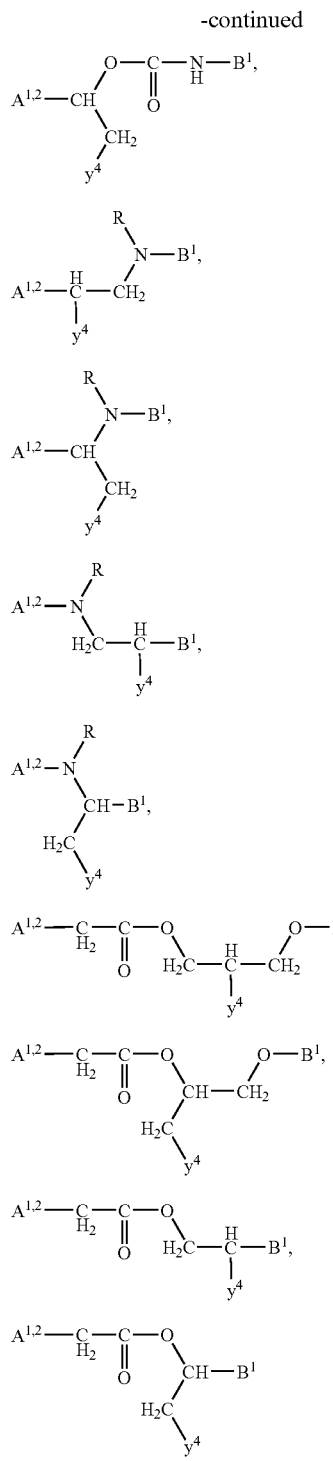

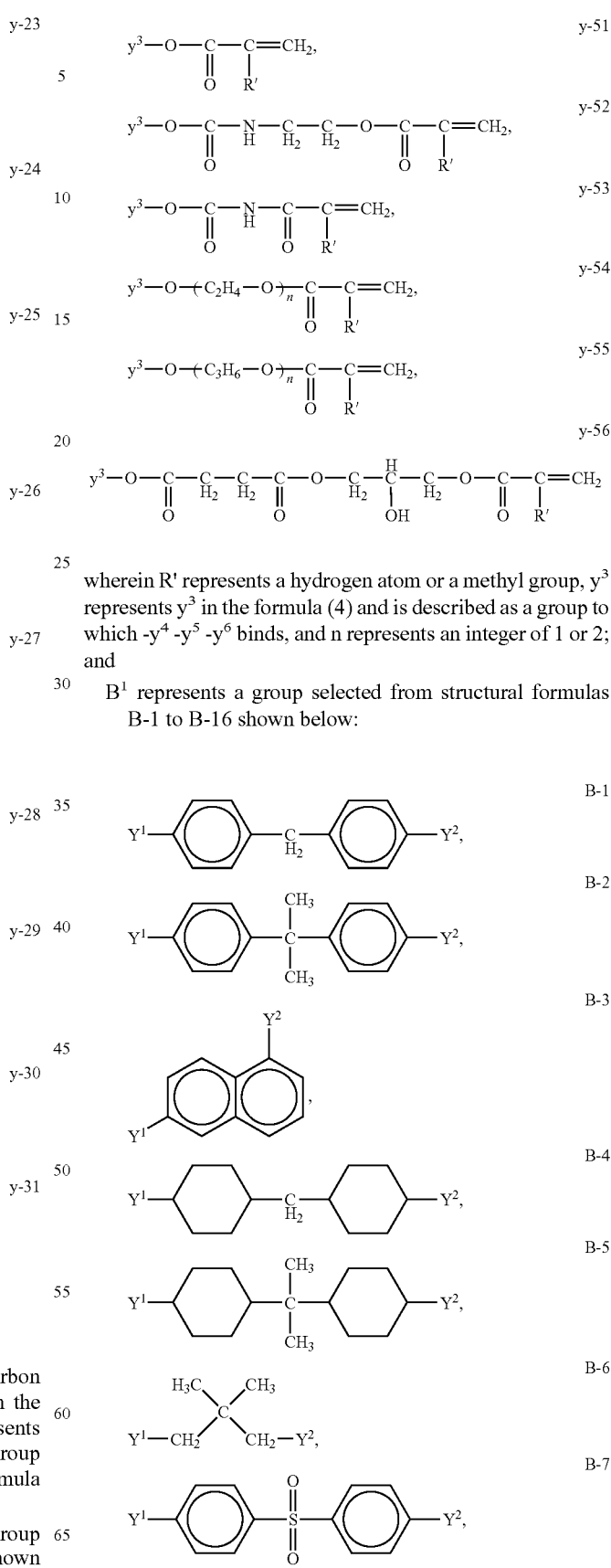

wherein R represents a hydrocarbon group of 1 to 3 carbon atoms or a phenyl group, $A^{1,2}$ represents $A^1$ or $A^2$ in the formula (1), $B^1$ represents $B^1$ in the formula (1), $y^4$ represents $y^4$ in the formula (4), and each group is described as a group to which a structure represented by the structural formula (y123) binds;

a structure of $-y^4$ $-y^5$ $-y^6$ which binds to $y^3$ is a group selected from structural formulas y-51 to y-56 shown below:

wherein R' represents a hydrogen atom or a methyl group, $y^3$ represents $y^3$ in the formula (4) and is described as a group to which $-y^4$ $-y^5$ $-y^6$ binds, and n represents an integer of 1 or 2; and $B^1$ represents a group selected from structural formulas B-1 to B-16 shown below:

-continued

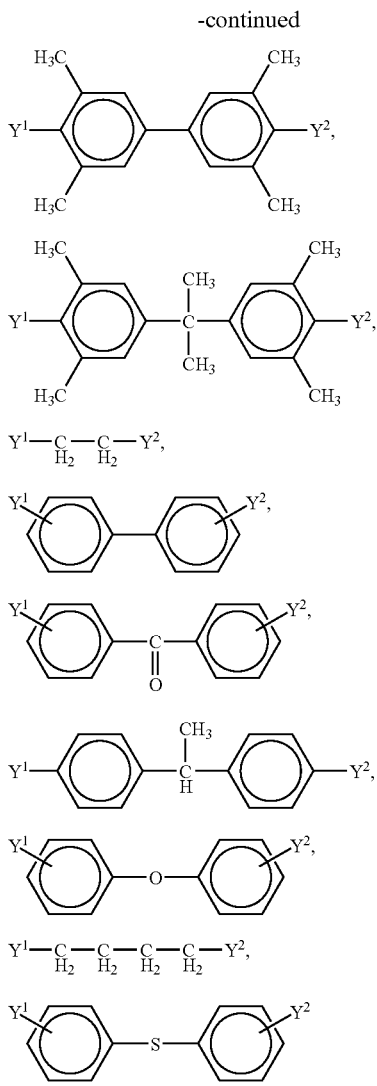

wherein $Y^1$ and $Y^2$ represent $Y^1$ and $Y^2$ in the formula (1), and are described as groups to which B binds.

4. The photocurable composition for the liquid cyrstal sealant according to claim 1, further comprising a photopolymerization initiator having an absorbance at 365 nm of 50 $M^{-1}$ $cm^{-1}$ or more.

5. The photocurable composition for the liquid crystal sealant according to claim 1, wherein the sum of atomic weights of atoms constituting the structures of $A^1$, $A^2$ and $B^1$ is 40% by mass or more based on the molecular weight of the compound represented by formula (1).

6. A liquid crystal panel wherein the components of the panel are sealed by applying and photocuring a photocurable composition for a liquid crystal sealant, and the photocurable composition for the liquid crystal sealant comprises a compound represented by formula (1):

wherein $A^1$ and $A^2$ each represents, independently, a monovalent group having a cyclic π-electron conjugated structure;

$Y^1$ and $Y^2$ each represents, independently, a divalent group represented by formula (4):

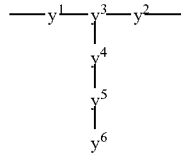

wherein $y^1$ and $y^2$ represent a linking group selected from a single bond, an ether bond, an ester bond, a urethane bond, and —NR—, wherein R represents an alkyl group of 1 to 4 carbon atoms, or a benzyl group, or a group in which one of the linking group and one of an alkylene group of 1 to 2 carbon atoms are linked, wherein the alkylene group is bonded to $A^1$ or $A^2$, in which $y^1$ is bonded to $A^1$ or $A^2$ and $y^2$ is bonded to $B^1$, $y^3$ represents an alkyltriyl group of 1 to 3 carbon atoms, $y^4$ represents a single bond, an ether bond, an ester bond, or a urethane bond, $y^5$ represents a single bond, an alkylene group of 1 to 5 carbon atoms, or an oxyalkylene group of 1 to 6 carbon atoms, wherein 2 to 4 oxyalkylene groups may be contiguous, or a phenylene group, wherein $y^4$ is invariably a single bond when $y^5$ is a single bond, and $y^6$ represents a polymerizable group selected from the group consisting of a (meth)acryloyl group, a (meth)acryloyloxy group, a (meth)acrylamide group, a vinyl group, and a vinyloxy group; and $B^1$ represents (i) a divalent alicyclic hydrocarbon group, (ii) a divalent aromatic hydrocarbon group, (iii) a divalent heterocyclic group, (iv) a divalent aliphatic hydrocarbon group of 1 to 6 carbon atoms, or (v) a divalent group in which two or more groups selected from the group consisting of a divalent alicyclic hydrocarbon group, a divalent aromatic hydrocarbon group, a divalent heterocyclic group, a divalent aliphatic hydrocarbon group of 1 to 6 carbon atoms, a carbonyl group, an ether group, a thioether group, and a $SO_2$ group are linked.

* * * * *